(12) United States Patent
Koyama et al.

(10) Patent No.: US 10,840,268 B2
(45) Date of Patent: *Nov. 17, 2020

(54) DISPLAY DEVICE AND ELECTRONIC DEVICE INCLUDING THE SAME

(71) Applicant: Semiconductor Energy Laboratory Co., Ltd., Atsugi (JP)

(72) Inventors: Jun Koyama, Sagamihara (JP); Shunpei Yamazaki, Setagaya (JP)

(73) Assignee: Semiconductor Energy Laboratories Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/988,534

(22) Filed: May 24, 2018

(65) Prior Publication Data

US 2018/0269233 A1 Sep. 20, 2018

Related U.S. Application Data

(63) Continuation of application No. 15/370,034, filed on Dec. 6, 2016, now Pat. No. 9,991,286, which is a
(Continued)

(30) Foreign Application Priority Data

Dec. 4, 2009 (JP) .................................. 2009-276918

(51) Int. Cl.
*H01L 27/12* (2006.01)
*G02F 1/1345* (2006.01)
(Continued)

(52) U.S. Cl.
CPC ...... *H01L 27/1225* (2013.01); *G02F 1/13454* (2013.01); *H01L 27/124* (2013.01);
(Continued)

(58) Field of Classification Search
None
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 1770788 A 4/2007
(Continued)

OTHER PUBLICATIONS

Nakayama.M et al., "17a-TL-8 Effect of GaO Layer on IGZO-TFT Channel", Extended Abstracts (The 57th Spring Meeting 2010), The Japan Society of Applied Physics and Related Societies, Mar. 17, 2010, pp. 21-008.
(Continued)

*Primary Examiner* — Long Pham
(74) *Attorney, Agent, or Firm* — Robinson Intellectual Property Law Office; Eric J. Robinson

(57) ABSTRACT

One embodiment of the present invention provides a highly reliably display device in which a high mobility is achieved in an oxide semiconductor. A first oxide component is formed over a base component. Crystal growth proceeds from a surface toward an inside of the first oxide component by a first heat treatment, so that a first oxide crystal component is formed in contact with at least part of the base component. A second oxide component is formed over the first oxide crystal component. Crystal growth is performed by a second heat treatment using the first oxide crystal component as a seed, so that a second oxide crystal component is formed. Thus, a stacked oxide material is formed. A transistor with a high mobility is formed using the stacked
(Continued)

oxide material and a driver circuit is formed using the transistor.

19 Claims, 20 Drawing Sheets

Related U.S. Application Data continuation of application No. 14/507,204, filed on Oct. 6, 2014, now Pat. No. 9,721,971, which is a continuation of application No. 13/570,297, filed on Aug. 9, 2012, now Pat. No. 8,866,138, which is a continuation of application No. 12/957,517, filed on Dec. 1, 2010, now Pat. No. 8,247,813.

(51) Int. Cl.

| | | |
|---|---|---|
| *H01L 29/786* | (2006.01) | |
| *H01L 29/66* | (2006.01) | |
| *H01L 29/04* | (2006.01) | |
| *G02F 1/1368* | (2006.01) | |
| *G02F 1/1333* | (2006.01) | |
| *G02F 1/1343* | (2006.01) | |
| *G02F 1/1362* | (2006.01) | |
| *G09G 3/3266* | (2016.01) | |
| *G09G 3/3275* | (2016.01) | |
| *G09G 3/36* | (2006.01) | |

(52) U.S. Cl.
CPC ........ *H01L 27/1285* (2013.01); *H01L 29/045* (2013.01); *H01L 29/66742* (2013.01); *H01L 29/66969* (2013.01); *H01L 29/7869* (2013.01); *G02F 1/1368* (2013.01); *G02F 1/13452* (2013.01); *G02F 1/133345* (2013.01); *G02F 1/134309* (2013.01); *G02F 1/136286* (2013.01); *G02F 2201/123* (2013.01); *G09G 3/3266* (2013.01); *G09G 3/3275* (2013.01); *G09G 3/3677* (2013.01); *G09G 3/3688* (2013.01); *G09G 2300/0426* (2013.01); *G09G 2310/0286* (2013.01); *G09G 2310/08* (2013.01); *G09G 2330/023* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,470,604 B2 | 12/2008 | Fujii | |
| 7,476,572 B2 | 1/2009 | Morisue et al. | |
| 7,501,293 B2 | 3/2009 | Ito et al. | |
| 7,511,343 B2 | 3/2009 | Li et al. | |
| 7,598,520 B2 | 10/2009 | Hirao et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,768,008 B2 | 8/2010 | Ishizaki et al. | |
| 7,804,088 B2 | 9/2010 | Tanaka et al. | |
| 7,884,360 B2 | 2/2011 | Takechi et al. | |
| 7,893,495 B2 | 2/2011 | Li et al. | |
| 7,977,169 B2 | 7/2011 | Hirao et al. | |
| 7,978,274 B2 | 7/2011 | Umezaki et al. | |
| 7,993,964 B2 | 8/2011 | Hirao et al. | |
| 7,994,500 B2 | 8/2011 | Kim et al. | |
| 8,054,279 B2 | 11/2011 | Umezaki et al. | |
| 8,058,645 B2 | 11/2011 | Jeong et al. | |
| 8,134,156 B2 | 3/2012 | Akimoto | |
| 8,148,779 B2 | 4/2012 | Jeong et al. | |
| 8,158,464 B2 | 4/2012 | Akimoto | |
| 8,158,974 B2 | 4/2012 | Yano et al. | |
| 8,188,480 B2 | 5/2012 | Itai | |
| 8,202,365 B2 | 6/2012 | Umeda et al. | |
| 8,203,143 B2 | 6/2012 | Imai | |
| 8,242,513 B2 | 8/2012 | Ohmae et al. | |
| 8,247,813 B2 | 8/2012 | Koyama et al. | |
| 8,274,078 B2 | 9/2012 | Itagaki et al. | |
| 8,354,674 B2 | 1/2013 | Kimura | |
| 8,368,079 B2 | 2/2013 | Akimoto | |
| 8,420,442 B2 | 4/2013 | Takechi et al. | |
| 8,520,159 B2 | 8/2013 | Umezaki et al. | |
| 8,525,165 B2 | 9/2013 | Akimoto | |
| 8,642,402 B2 | 2/2014 | Yano et al. | |
| 8,743,044 B2 | 6/2014 | Umezaki et al. | |
| 8,748,879 B2 | 6/2014 | Yano et al. | |
| 8,779,419 B2 | 7/2014 | Yano et al. | |
| 8,785,240 B2 | 7/2014 | Watanabe | |
| 8,866,138 B2 | 10/2014 | Koyama et al. | |
| 8,889,480 B2 | 11/2014 | Takechi et al. | |
| 8,902,145 B2 | 12/2014 | Umezaki et al. | |
| 8,908,115 B2 | 12/2014 | Umezaki et al. | |
| 8,962,457 B2 | 2/2015 | Watanabe | |
| 9,263,468 B2 | 2/2016 | Umezaki et al. | |
| 9,536,903 B2 | 1/2017 | Umezaki et al. | |
| 9,606,408 B2 | 3/2017 | Umezaki et al. | |
| 9,721,971 B2 * | 8/2017 | Koyama | G02F 1/13454 |
| 9,842,861 B2 | 12/2017 | Umezaki et al. | |
| 9,991,286 B2 | 6/2018 | Koyama et al. | |
| 10,048,558 B2 | 8/2018 | Umezaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0004220 A1 | 1/2004 | Suzuki | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0275038 A1 | 12/2005 | Shih et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |

(56) References Cited

U.S. PATENT DOCUMENTS

| | | |
|---|---|---|
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287221 A1 | 12/2007 | Ong et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0065837 A1 | 3/2010 | Omura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0193785 A1 | 8/2010 | Kimura |
| 2010/0320458 A1 | 12/2010 | Umeda et al. |
| 2010/0320459 A1 | 12/2010 | Umeda et al. |
| 2011/0193083 A1 | 8/2011 | Kim et al. |
| 2011/0215328 A1 | 9/2011 | Morosawa et al. |
| 2012/0119205 A1 | 5/2012 | Taniguchi et al. |
| 2018/0158839 A1 | 6/2018 | Umezaki et al. |
| 2018/0348561 A1 | 12/2018 | Umezaki et al. |
| 2020/0052004 A1 | 2/2020 | Koyama et al. |

FOREIGN PATENT DOCUMENTS

| | | |
|---|---|---|
| EP | 1906414 A | 4/2008 |
| EP | 1921681 A | 5/2008 |
| EP | 1993150 A | 11/2008 |
| EP | 2226847 A | 9/2010 |
| EP | 3223283 A | 9/2017 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-045496 A | 2/1998 |
| JP | 11-505377 | 5/1999 |
| JP | 11-213763 A | 8/1999 |
| JP | 2000-026119 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-150203 A | 6/2005 |
| JP | 2005-303150 A | 10/2005 |
| JP | 2005-311335 A | 11/2005 |
| JP | 2006-133762 A | 5/2006 |
| JP | 2007-096055 A | 4/2007 |
| JP | 2007-123861 A | 5/2007 |
| JP | 2007-165861 A | 6/2007 |
| JP | 2007-220820 A | 8/2007 |
| JP | 2007-281486 A | 10/2007 |
| JP | 2008-042088 A | 2/2008 |
| JP | 2008-098637 A | 4/2008 |
| JP | 2008-116652 A | 5/2008 |
| JP | 2008-533693 | 8/2008 |
| JP | 2008-277665 A | 11/2008 |
| JP | 2008-281988 A | 11/2008 |
| JP | 2008-283013 A | 11/2008 |
| JP | 2008-283046 A | 11/2008 |
| JP | 2009-033145 A | 2/2009 |
| JP | 2009-167087 A | 7/2009 |
| JP | 2009-231613 A | 10/2009 |
| JP | 2009-231664 A | 10/2009 |
| JP | 2009-267399 A | 11/2009 |
| JP | 2010-016347 A | 1/2010 |
| JP | 4415062 | 2/2010 |
| JP | 2010-067954 A | 3/2010 |
| JP | 2010-177431 A | 8/2010 |
| JP | 4571221 | 10/2010 |
| JP | 2011-139056 A | 7/2011 |
| JP | 2012-160679 A | 8/2012 |
| KR | 2003-0097720 A | 12/2003 |
| KR | 2008-0029796 A | 4/2008 |
| KR | 2008-0029807 A | 4/2008 |
| KR | 2008-0066678 A | 7/2008 |
| KR | 2008-0101805 A | 11/2008 |
| WO | WO-2004/114391 | 12/2004 |
| WO | WO-2005/093813 | 10/2005 |
| WO | WO-2007/058329 | 5/2007 |
| WO | WO-2007/094501 | 8/2007 |
| WO | WO-2007/142167 | 12/2007 |
| WO | WO-2008/096768 | 8/2008 |
| WO | WO-2008/117739 | 10/2008 |
| WO | WO-2008/126879 | 10/2008 |
| WO | WO-2008/133345 | 11/2008 |
| WO | WO-2008/136505 | 11/2008 |
| WO | WO-2008/143021 | 11/2008 |
| WO | WO-2011/068017 | 6/2011 |

OTHER PUBLICATIONS

International Search Report (Application No. PCT/JP2010/070062) dated Feb. 8, 2011.

Written Opinion (Application No. PCT/JP2010/070062) dated Feb. 8, 2011.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by

(56) References Cited

OTHER PUBLICATIONS

Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9 and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AMOLED Driven by PEALD Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

(56) References Cited

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Kim.H et al., "High Performance Solution-Processed Indium Oxide Thin-Film Transistors", J. Am. Chem. Soc. (Journal of the American Chemical Society), Aug. 29, 2008, vol. 130, No. 38, pp. 12580-12581.

Korean Office Action (Application No. 2012-7017051) dated Jan. 10, 2017.

Fingerprint Cards (FPC), http://www.wpgholdings.com/productline/detail/zhtw/Fingerprints.

Taiwanese Office Action (Application No. 106105944) dated Dec. 14, 2017.

\* cited by examiner

|  | Frame frequency (Hz) | | |
| --- | --- | --- | --- |
|  | 60 | 120 | 240 |
| a (us) | 15.3 | 7.63 | 3.81 |
| b (us) | 3.56 | 1.66 | 0.703 |
| c (us) | 1.2 | 0.6 | 0.3 |

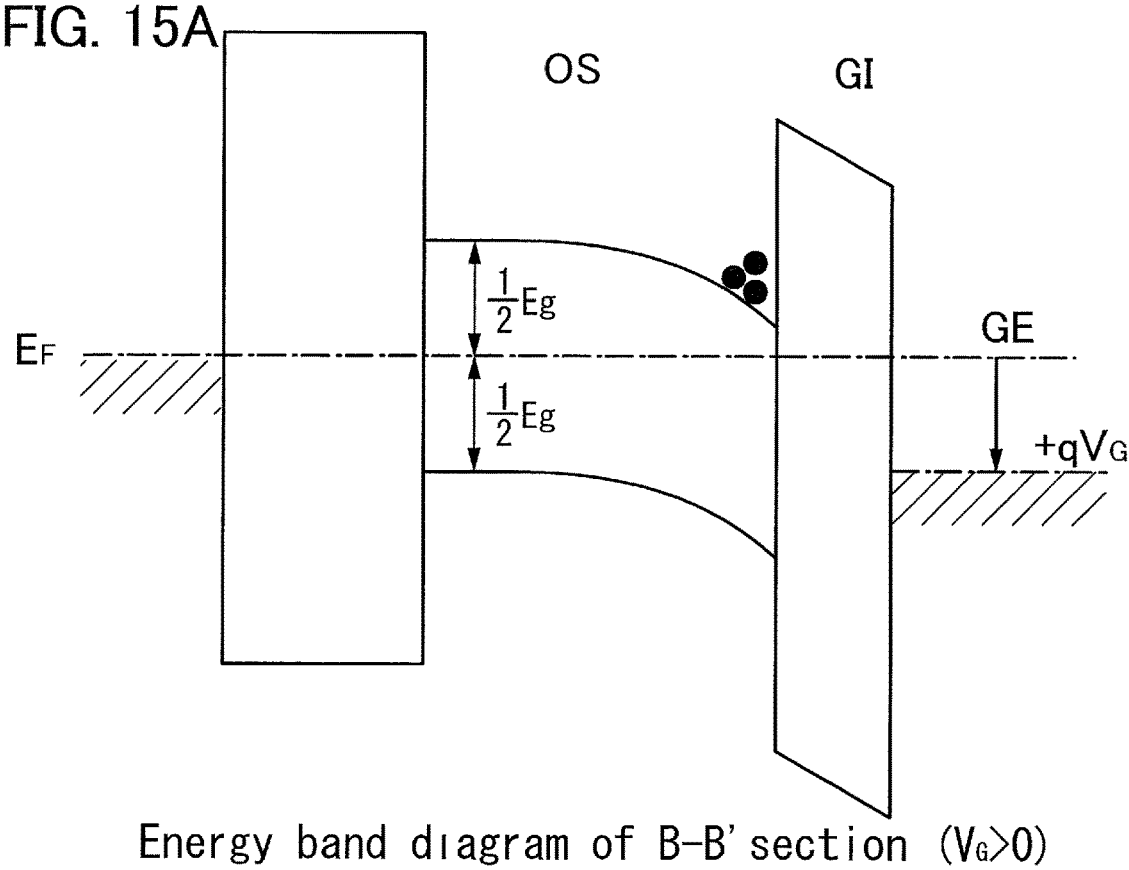
Energy band diagram of B-B' section ($V_G$>0)
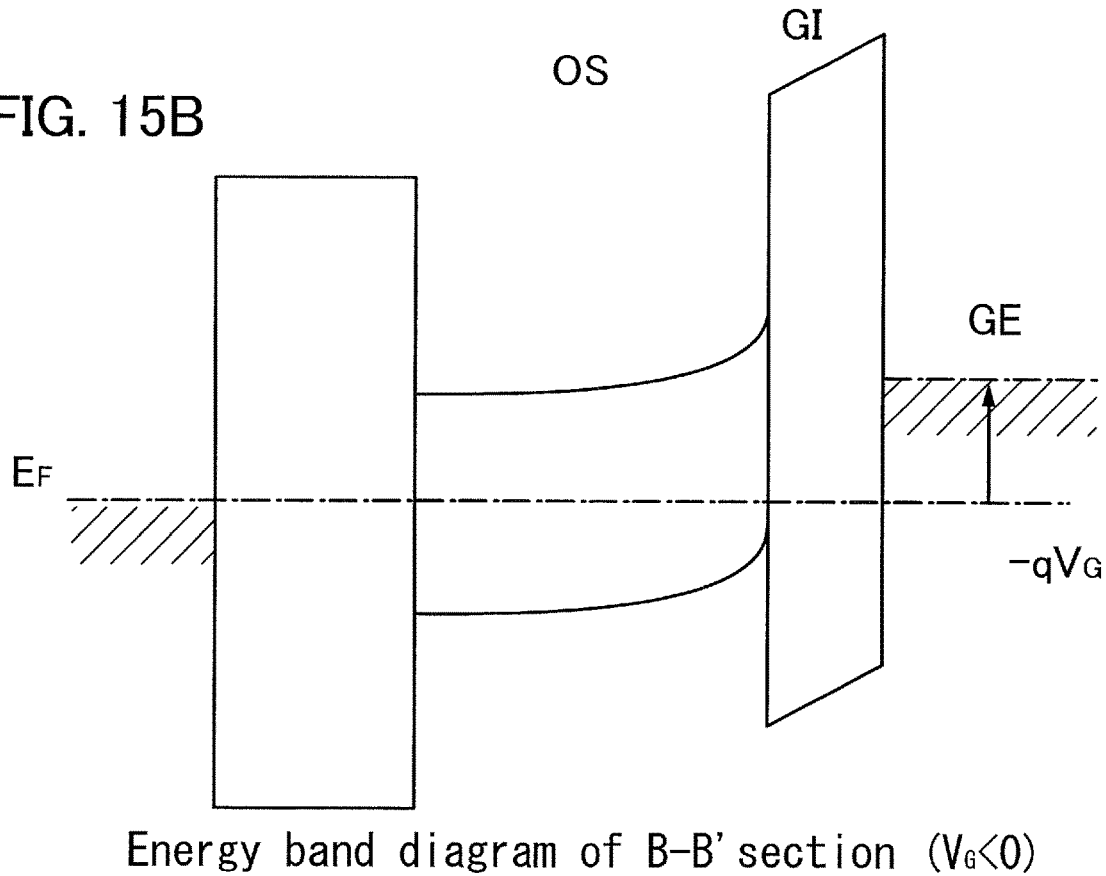
Energy band diagram of B-B' section ($V_G$<0)

DISPLAY DEVICE AND ELECTRONIC DEVICE INCLUDING THE SAME

TECHNICAL FIELD

The present invention relates to a display device including an oxide semiconductor, a manufacturing method thereof, and an electronic appliance including the display device.

BACKGROUND ART

Transistors formed over a glass substrate or the like are typically manufactured using amorphous silicon, polycrystalline silicon, or the like, as typically seen in liquid crystal display devices. Although transistors including amorphous silicon have low field effect mobility, they can be formed over a larger glass substrate. On the other hand, although transistors including polycrystalline silicon have high field effect mobility, they are not suitable for being formed over a larger glass substrate.

In view of the foregoing, attention has been drawn to a technique by which a transistor is manufactured using an oxide semiconductor, and such a transistor is applied to an electronic appliance or an optical device. For example, a technique of manufacturing a transistor by using zinc oxide or In—Ga—Zn—O-based oxide as oxide semiconductor, and using the transistor for a switching element of a pixel of a display device and the like is disclosed in Patent Document 1 and Patent Document 2.

REFERENCE

Patent Document

[Patent Document 1] Japanese Published Patent Application No. 2007-123861

[Patent Document 2] Japanese Published Patent Application No. 2007-096055

DISCLOSURE OF INVENTION

The field effect mobility of a transistor in which a channel region is formed in an oxide semiconductor is higher than that of a transistor in which a channel region is formed in amorphous silicon. The field effect mobility of a transistor formed using amorphous silicon is approximately 0.5 $cm^2$/Vs in general, whereas the field effect mobility of a transistor formed using an oxide semiconductor is 10 $cm^2$/Vs to 20 $cm^2$/Vs. In addition, an active layer can be formed using an oxide semiconductor by a sputtering method or the like, and a manufacturing process thereof is simpler than that of a transistor including polycrystalline silicon formed using a laser device.

Transistors which are manufactured using such an oxide semiconductor over a glass substrate or a plastic substrate are expected to be applied to liquid crystal display devices, organic EL display devices, electronic paper, and the like.

Meanwhile, large-sized display devices are spreading. Televisions with display screens having a diagonal of 40 inches to 50 inches are becoming common as home televisions and are expected to become more popular in the future. As described above, a transistor formed using an oxide semiconductor has a field effect mobility which is 10 or more times as high as that of a transistor formed using amorphous silicon; therefore, the transistor formed using an oxide semiconductor can have properties sufficient to be used as a switching element of a pixel even in a large-sized display device.

However, when not only a pixel but also a driver circuit is formed using a transistor formed using an oxide semiconductor, a transistor formed using a conventional oxide semiconductor does not have sufficient characteristics. Specifically, the field effect mobility of the conventional oxide semiconductor needs to be increased by several times in order to improve the current capability of a transistor. In the case where a driver is formed using a transistor formed using an oxide semiconductor with a field effect mobility of 10 $cm^2$/Vs, the size of a display device should be smaller than 20 inches; therefore, when a larger-sized display device is manufactured, a driver needs to be additionally mounted.

An embodiment of the present invention disclosed in this specification is an active matrix display device including a plurality of pixels, a plurality of signal lines, and a plurality of scan lines over an insulating substrate. The display device includes a transistor formed using an oxide semiconductor with a field effect mobility of at least 50 $cm^2$/Vs or higher, preferably 100 $cm^2$/Vs or higher over the insulating substrate. The display device also includes a gate driver and an analog switch for driving a source line each including the transistor as one of its elements.

The size of the above display device is at least 20 inches.

An embodiment of the present invention disclosed in this specification is an active matrix display device including a plurality of pixels, a plurality of signal lines, and a plurality of scan lines over an insulating substrate. The display device includes a transistor formed using an oxide semiconductor with a field effect mobility of at least 50 $cm^2$/Vs or higher, preferably 100 $cm^2$/Vs or higher over the insulating substrate. The display device also includes a gate driver and a source driver each including the transistor as one of its elements.

The size of the above display device is at least 20 inches.

One method for improving a field effect mobility is a method for manufacturing a stacked oxide material, including the steps of forming a layer of an oxide component over a base component, performing crystal growth which proceeds from a surface toward an inside of the oxide component by heat treatment to form a first oxide crystal component at least partly in contact with the base component, and stacking a second oxide crystal component over the first oxide crystal component. In particular, the first oxide crystal component and the second oxide crystal component have common c-axes. Note that the first oxide crystal component has its c-axis-aligned perpendicularly to a surface of the first oxide crystal component. Note that on an a-b plane, elements adjacent to each other are identical. In addition, the c-axis direction of the first oxide crystal component corresponds to the depth direction.

In the above manufacturing method, at least part or the whole of a bottom surface of the first oxide crystal component in which crystals are aligned is provided to be in contact with the base component. By appropriately adjusting the thickness of the oxide component, heating conditions, or the like, the bottom surface of the first oxide crystal component in which crystals are aligned is provided so that at least part or the whole of the bottom surface is in contact with the base component.

In the above manufacturing method, annealing is performed after deposition of the first oxide component as a first oxide semiconductor layer and a second oxide component is deposited as a second oxide semiconductor layer over a top surface of the first oxide crystal component. After that, a crystal is grown from the interface between the first oxide semiconductor layer and the second oxide semiconductor layer toward a surface of the second oxide semiconductor layer which is an upper layer. The first oxide crystal component corresponds to a seed crystal for the second oxide component. It is important to form, above the first oxide crystal component, the second oxide crystal component as a polycrystalline layer.

As crystallinity of an oxide semiconductor layer is higher, a transistor with high field effect mobility can be realized.

As the crystallinity of the oxide semiconductor layers is increased, the amount of change in the threshold voltage of a transistor before and after a BT test can be reduced, so that high reliability can be obtained.

In addition, as the crystallinity of the oxide semiconductor layers is increased, temperature dependence of electric characteristics of the transistor, for example, the amount of change in on current or off current at temperatures of from −30° C. to 120° C. can be reduced.

One feature of the above structure is that the oxide crystal component in which a c-axis-aligned crystal is in contact with the base component is a polycrystalline component.

A technical idea of the present invention is that an impurity is not added to an oxide semiconductor and on the contrary, the oxide semiconductor itself is highly purified by intentionally removing an impurity such as water or hydrogen which undesirably exists therein. In other words, the technical idea is to highly purify an oxide semiconductor by removing water or hydrogen which forms a donor level, reducing oxygen deficiency, and sufficiently supplying oxygen that is a main component of the oxide semiconductor.

When an oxide semiconductor is deposited, hydrogen at density of $10^{20}$ cm$^{-3}$ is measured using secondary ion mass spectrometry (SIMS). The oxide semiconductor is highly purified and made to be an i-type (intrinsic) semiconductor by intentionally removing water or hydrogen which forms a donor level and simultaneously adding oxygen (one of the components of the oxide semiconductor).

Further, in a technical idea of the present invention, it is preferable that the amount of water and hydrogen in an oxide semiconductor be as small as possible, and it is also preferable that the number of carriers in the oxide semiconductor be also as small as possible. In other words, a carrier density of less than $1 \times 10^{12}$ cm$^{-3}$, preferably less than $1.45 \times 10^{10}$ cm$^{-3}$ which is less than or equal to the measurement limit is needed. In addition, an ideal career density is 0 or approximately 0 in the technical idea of the present invention. In particular, when an oxide semiconductor is subjected to heat treatment in an oxygen atmosphere, a nitrogen atmosphere, or an atmosphere of ultra-dry air (air in which the water content is less than or equal to 20 ppm, preferably less than or equal to 1 ppm, more preferably less than or equal to 10 ppb) at a temperature higher than or equal to 450° C. and lower than or equal to 850° C., preferably higher than or equal to 550° C. and lower than or equal to 750° C., water or hydrogen which would form an n-type impurity can be removed and the oxide semiconductor can be highly purified. In addition, when the oxide semiconductor is highly purified by removing an impurity such as water or hydrogen, the carrier density thereof can be less than $1 \times 10^{12}$ cm$^{-3}$, preferably less than $1.45 \times 10^{10}$ cm$^{-3}$ which is less than or equal to the measurement limit.

In addition, when the heat treatment is performed at a high temperature, that is, a temperature higher than or equal to 450° C. and lower than or equal to 850° C., preferably higher than or equal to 600° C. and lower than or equal to 700° C., the oxide semiconductor can be highly purified and also crystallized, and crystal growth proceeds from a surface of the oxide semiconductor toward the inside thereof, so that the oxide semiconductor has polycrystalline regions whose c-axis is aligned.

As for the oxide semiconductor used in the present invention, the oxide semiconductor having polycrystalline regions whose c-axis is aligned is used as a seed crystal, a second oxide semiconductor is formed thereover, and heat treatment is performed at a temperature higher than or equal to 450° C. and lower than or equal to 850° C., preferably higher than or equal to 550° C. and lower than or equal to 750° C., so that the second oxide semiconductor can have a polycrystalline region whose c-axis is aligned in a manner similar to that of the seed crystal. That is to say, ideal axial growth or epitaxial growth in which the seed crystal and the second oxide semiconductor have c-axes which are aligned in the same direction can be performed.

The second oxide semiconductor having the same axis as the seed crystal can be stacked and also the crystal thereof can be grown not only by performing solid-phase growth by heat treatment after deposition but also by depositing with the use of typically sputtering in a state where heating is performed at a temperature higher than or equal to 200° C. and lower than or equal to 600° C. Further, when a substrate is heated at higher than or equal to 200° C. and lower than or equal to 600° C. in formation of the oxide semiconductor film by a sputtering method, epitaxial growth or axial growth can be performed.

In addition, carriers in the oxide semiconductor are reduced, or preferably all carriers are removed, so that the oxide semiconductor serves as a path through which carriers pass in a transistor. As a result, the oxide semiconductor is a highly purified i-type (intrinsic) semiconductor which has no carrier or very few carriers, so that off current of a transistor in an off state can be extremely low, which is the technical idea of the present invention.

In addition, when the oxide semiconductor serves as a path and the oxide semiconductor itself is a highly purified i-type (intrinsic) semiconductor which has no carriers or very few carriers, carriers are supplied by a source electrode and a drain electrode. When the electron affinity $\chi$, the Fermi level, preferably corresponding to the intrinsic Fermi level in the oxide semiconductor, and the work functions of the source and drain electrodes are selected as appropriate, carriers can be injected from the source electrode and the drain electrode. Therefore, an n-channel transistor and a p-channel transistor can be manufactured as appropriate.

All of the oxide crystal components and the oxide components are formed using metal oxides, and any of the following metal oxide films can be used: a four-component metal oxide film such as an In—Sn—Ga—Zn—O-based film; a three-component metal oxide film such as an In—Ga—Zn—O-based film, an In—Sn—Zn—O-based film, an In—Al—Zn—O-based film, a Sn—Ga—Zn—O-based film, an Al—Ga—Zn—O-based film, or a Sn—Al—Zn—O-based film; a two-components metal oxide film such as an In—Zn—O-based film, a Sn—Zn—O-based film, an Al—Zn—O-based film, a Zn—Mg—O-based film, a Sn—Mg—O-based film, or an In—Mg—O-based film; or an In—O-based film, a Sn—O-based film, or a Zn—O-based film. Note that here, for example, an In—Sn—Ga—Zn—O-based film means a metal oxide film including indium (In), tin (Sn), gallium (Ga), and zinc (Zn) and there is no particular limitation on the stoichiometric proportion.

As the oxide crystal components and the oxide components, a thin film expressed by $InMO_3(ZnO)_m$ (m>0, and m is not a natural number) can be used. Here, M represents one or more metal elements selected from Ga, Al, Mn, and Co. For example, M can be Ga, Ga and Al, Ga and Mn, Ga and Co, or the like.

In addition, an oxide semiconductor material expressed by In-A-B—O may be used. Here, A represents one or plural kinds of elements selected from elements belonging to Group 13, such as gallium (Ga) or aluminum (Al), elements belonging to Group 14 typified by silicon (Si) or germanium (Ge), and the like. In addition, B represents one or plural kinds of elements selected from elements belonging to Group 12 typified by zinc (Zn). Note that the In content, the A content, and the B content are set freely, and the case where the A content is 0 is included. On the other hand, the In content and the B content are not 0. In other words, the above expression includes In—Ga—Zn—O, In—Zn—O, and the like. In addition, an oxide semiconductor material expressed by In—Ga—Zn—O in this specification is $InGaO_3(ZnO)_m$ (m>0, and m is not a natural number), and it can be confirmed using analysis with ICP-MS or RBS that m is not a natural number.

In addition, as one step for high purification, first heat treatment is performed in an atmosphere which hardly contains hydrogen and moisture (such as a nitrogen atmosphere, an oxygen atmosphere, or a dry-air atmosphere (for example, as for the moisture, a dew point is lower than or equal to −40° C., preferably lower than or equal to −50° C.)). The first heat treatment can be called dehydration or dehydrogenation, which is for removing H, OH, or the like from the oxide semiconductor layer. In the case where temperature is raised in an inert atmosphere and then the atmosphere is switched to an atmosphere containing oxygen during heat treatment, or in the case where an oxygen atmosphere is employed, the first heat treatment can also be called additional oxidation treatment.

For the first heat treatment for dehydration or dehydrogenation, a heating method using an electric furnace, a rapid heating method such as a gas rapid thermal anneal (GRTA) method using a heated gas or a lamp rapid thermal anneal (LRTA) method using lamp light, or the like can be used. In addition, as the first heat treatment, heating with irradiation with light having a wavelength less than or equal to 450 nm may be performed at the same time. The oxide semiconductor layer which is subjected to the first heat treatment for high purification is heated under conditions that at least a peak at around 300° C. of two peaks of water are/is not detected when the oxide semiconductor layer after the first heat treatment is measured with thermal desorption spectroscopy (TDS) while the temperature is increased to 450° C. Therefore, even if TDS is performed at up to 450° C. on a transistor including the oxide semiconductor layer which is subjected to heat treatment for high purification, at least the peak of water at around 300° C. is not detected.

Since crystal growth is performed in a state where there is no polycrystalline layer which serves as a seed of crystal growth, it is preferable that the first heat treatment be performed at high temperature for a short time so that only crystal growth from a surface is performed. In addition, when a surface of the oxide semiconductor layer is flat, a favorable plate-shaped polycrystalline layer can be obtained. Therefore, it is preferable that flatness of a base component such as an insulating layer or a substrate be as high as possible. Increase of flatness is effective because a polycrystalline layer in contact with an entire surface of the base component can be formed easily. For example, the flatness of the oxide semiconductor layer is approximately equivalent to that of a commercial silicon wafer; for example, difference in height of surface roughness in a region of 1 μm×1 μm by AFM measurement is less than or equal to 1 nm, preferably 0.2 nm.

In the polycrystalline layer, when electron clouds of In included in the oxide semiconductor overlap with each other and are connected to each other, electric conductivity σ is increased. Accordingly, a transistor including the polycrystalline layer can have high field effect mobility.

One of methods for further performing crystal growth with the use of the plate-shaped polycrystalline layer formed by the first heat treatment as a seed is described below with reference to FIGS. 1A, 1B, and 1C.

The outline of the order of steps is as follows: the first oxide semiconductor layer is formed over the base component; first heat treatment for high purification is performed; the polycrystalline layer whose crystal direction is aligned is formed over a surface of the first oxide semiconductor layer in the same step as the first heat treatment for high purification; the second oxide semiconductor layer is stacked thereover; and further, second heat treatment for crystallization is performed, so that the second oxide semiconductor layer is crystallized with the use of the polycrystalline layer over the surface of the first oxide semiconductor layer as a seed.

In the first heat treatment, crystal growth is performed from the surface in the state where a crystal layer serving as a seed of crystal growth is not present, whereas in the second heat treatment, the plate-shaped polycrystalline layer serving as a seed is present. Therefore, it is preferable that the second heat treatment be performed for a long time at a lowest temperature at which crystal growth can be performed because favorable crystallinity can be obtained. The crystal-growth direction obtained by the second heat treatment corresponds to an upward direction from a lower portion, i.e., a direction from the substrate side to the surface side (also referred to as recrystallization direction) and is different from that in the first heat treatment. In addition, since the polycrystalline layer obtained by the first heat treatment is heated again by the second heat treatment, the crystallinity of the polycrystalline layer is further increased.

FIG. 1A illustrates a state where first heat treatment for crystallization is performed on a first oxide semiconductor layer formed over a base component 500. The first heat treatment is performed in an oxygen atmosphere, a nitrogen atmosphere, or an ultra-dry air atmosphere at higher than or equal to 450° C. and lower than or equal to 850° C., preferably higher than or equal to 550° C. and lower than or equal to 750° C. Further, heat treatment may be performed such that temperature is raised in an inert gas atmosphere and then the atmosphere is switched to an atmosphere containing oxygen, or heat treatment in an oxygen atmosphere may be performed. After the first heat treatment, the first oxide semiconductor layer becomes a first oxide crystal component 501 of a plate-shaped polycrystal which is c-axis-aligned perpendicularly to a surface.

FIG. 1B is a cross-sectional view of a state just after formation of a second oxide semiconductor layer 502. The second oxide semiconductor layer 502 is formed by a sputtering method, and a metal oxide target such as a metal oxide target with In:Ga:Zn=1:1:1 [atomic ratio] or a metal oxide target with In:Ga:Zn=1:1:2 may be used.

FIG. 1C illustrates a cross-sectional view posterior to the second heat treatment. By the second heat treatment, crystal growth proceeds upward toward a surface of the second oxide semiconductor layer 502 with the use of the polycrystalline layer of the first oxide crystal component 501 as a seed. As a result, a second oxide crystal component 503b is formed, so that all the crystal components are c-axis-aligned.

The second heat treatment can also be called dehydration or dehydrogenation which is for removing H, OH, or the like from the oxide semiconductor layer. In the case where temperature is raised in an inert atmosphere and then the atmosphere is switched to an atmosphere containing oxygen, or in the case where an oxygen atmosphere is employed, the second heat treatment can also be called additional oxidation treatment.

Further, the polycrystalline layer obtained in the first heat treatment is heated again in the second heat treatment; accordingly, a third oxide crystal component 503a in which crystallinity is further improved is obtained.

The hydrogen concentration in the oxide semiconductor layer is lower than or equal to $1 \times 10^{18}$ cm$^{-3}$, preferably lower than or equal to $1 \times 10^{16}$ cm$^{-3}$, more preferably substantially 0. The carrier density of the oxide semiconductor layer is lower than $1 \times 10^{12}$ cm$^{-3}$, preferably lower than $1.45 \times 10^{10}$ cm$^{-3}$ which is lower than or equal to the measurement limit. That is, the carrier density of the oxide semiconductor layer is as close to zero as possible. Furthermore, the band gap of the oxide semiconductor is greater than or equal to 2 eV, preferably greater than or equal to 2.5 eV, more preferably greater than or equal to 3 eV. Note that the hydrogen concentration of an oxide semiconductor layer can be measured by secondary ion mass spectrometry (SIMS). The carrier density can be measured by the Hall effect measurement. Lower carrier density $N_d$ can be obtained with the use of a measurement result of capacitance-voltage (CV) measurement and Formula 1.

$$N_d = -\left(\frac{2}{e\varepsilon_0\varepsilon}\right) \frac{d(1/C)^2}{dV} \quad \text{[Formula 1]}$$

In addition, it can be said that FIG. 1C illustrates a two-layer structure in which the third oxide crystal component 503a is provided on and in contact with the base component 500 and the second oxide crystal component 503b is stacked thereon. There are no particular limitations on materials of the first oxide crystal component 501 and the second oxide crystal component 503b as long as a polycrystal which is c-axis-aligned perpendicularly to the surface can be obtained. The materials of the first oxide crystal component 501 and the second oxide crystal component 503b may be different or may contain the same components. "Containing the same components" means that the same element is included therein.

Note that in the case where oxide semiconductor materials containing the same components are used, a boundary between the third oxide crystal component 503a and the second oxide crystal component 503b is unclear as illustrated by a dotted line in FIG. 1C, so that a single-layer structure is obtained.

In this manner, the polycrystalline layer formed of a stack of the third oxide crystal component 503a and the second oxide crystal component 503b can be obtained by crystal growth by separately performing two heat treatments.

Note that in FIG. 1A, crystal growth of the plate-shaped crystal layer whose crystal direction is relatively aligned over the surface of the first oxide semiconductor layer proceeds in the depth direction from the surface; therefore, the polycrystalline layer can be formed without being influenced by the base component.

An example of a mechanism in which the crystal layer whose crystal direction is relatively aligned is formed on the surface of the first oxide semiconductor layer, for example, of an In—Ga—Zn—O film is described. By heat treatment, zinc included in the In—Ga—Zn—O film is dispersed and concentrated at the vicinity of the surface, and becomes a seed of crystal growth. At the time of the crystal growth, crystal growth in the horizontal direction (a direction parallel to the surface) more strongly proceeds than crystal growth in the depth direction (a direction vertical to the surface); therefore, the plate-shaped polycrystalline layer is formed. That is, the first oxide semiconductor layer is more likely crystallized in the direction of the a-b plane than in the direction of the c-axis. In addition, a-b planes in crystals do not correspond to each other. In addition, since a space above the surface of the In—Ga—Zn—O film is a free space, crystal growth proceeding upward in this free space does not occur. These are supposed from the fact that when TDS measurement is performed to 450° C., peaks of In and Ga are not detected but a peak of zinc is detected in a vacuum-heat condition, in particular at around 300° C. Note that it can be confirmed that the TDS measurement is performed in vacuum and emission of zinc is detected from a temperature around 200° C.

It can be said that a plate-shaped layer having a large thickness can be formed in such a manner that two depositions of oxide semiconductor films are performed so that a polycrystalline layer to be a seed of crystal growth is formed and then a second film is deposited, and then crystal growth is performed. Accordingly, the method disclosed in this specification is extremely effective.

In addition, the method is also useful in that a crystal layer which has the a-b plane parallel to a surface and is c-axis-aligned in a direction perpendicular to the surface can be obtained regardless of a material of a base component.

A device formed using a metal oxide, typically an In—Ga—Zn—O film is totally different from a device formed using a single crystal Si, a device formed using SiC, and a device formed using GaN.

As a wide-gap semiconductor, SiC (3.26 eV) and GaN (3.39 eV) are known. However, SiC and GaN are expensive materials. Further, SiC and GaN require a process temperature of 1500° C. or higher; thus, it is practically impossible to form a thin film thereof over a glass substrate.

Further, the crystal structure of SiC or GaN is only a single crystal. Therefore, control with a PN junction is needed and more complete single-crystallization is needed. Accordingly, since a small amount of impurities which are unintentionally mixed in a manufacturing process serves as donors or acceptors, the carrier concentration has lower limit. In contrast, a metal oxide can have any of an amorphous structure, a polycrystalline structure, and a single crystalline structure. One feature of a metal oxide is that control of a band which is equivalent to a PN junction is performed by utilizing each of properties of $\phi_{MS}$ versus $\chi_{OS}+1/2Eg^{OS}$, $\phi_{MD}$ versus $\chi_{OS}+1/2Eg^{OS}$, work functions of a source and a drain, electron affinity of metal oxide, and energy band width, without using control with a PN junction.

A metal oxide, typically an In—Ga—Zn—O film has a band gap which is three times as wide as that of single crystal silicon and is an inexpensive material because of a low manufacturing cost as compared with SiC.

The band gap of In—Ga—Zn—O is 3.05 eV. The intrinsic carrier density is calculated based on this value. It is known that the energy distribution f(E) of electrons in a solid is based on the Fermi-Dirac statistics represented by the following formula.

$$f(E) = \frac{1}{1 + \exp\left(\frac{E - E_F}{kT}\right)} \quad \text{[Formula 2]}$$

In the case of a normal semiconductor whose carrier density is not very high (which does not degenerate), the following relational expression is satisfied.

$$|E - E_F| > kT \quad \text{[Formula 3]}$$

Accordingly, the Fermi-Dirac distribution of the formula (1) can be approximated by the formula of the Boltzmann distribution represented by the following formula.

$$f(E) = \exp\left[-\frac{E - E_F}{kT}\right] \quad \text{[Formula 4]}$$

When the intrinsic carrier density ($n_i$) of the semiconductor is calculated with the formula (3), the following formula can be obtained.

$$n_i = \sqrt{N_C N_V}\, \exp\left(-\frac{E_g}{2kT}\right) \quad \text{[Formula 5]}$$

Then, the values of effective density of states (Nc and Nv) of Si and In—Ga—Zn—O and the band gaps (Eg) thereof are substituted into the expression (4) and the intrinsic carrier density is calculated. The results are shown in Table 1.

TABLE 1

|  | Si | IGZO |
|---|---|---|
| Nc (300K) [cm$^{-3}$] | 2.8 × 10$^{19}$ | 5.0 × 10$^{18}$ |
| Nv (300K) [cm$^{-3}$] | 1.04 × 10$^{19}$ | 5.0 × 10$^{18}$ |
| Eg (300K) [eV] | 1.08 | 3.05 |
| n$_i$ (300K) [cm$^{-3}$] | 1.45 × 10$^{10}$ | 1.2 × 10$^{-7}$ |

It is found that In—Ga—Zn—O has extremely low intrinsic carrier density when compared to Si. In the case where the value of 3.05 eV is selected as a band gap of IGZO, it can be said that the carrier density of Si is approximately 10$^{17}$ times as large as that of In—Ga—Zn—O, assuming that the Fermi-Dirac distribution law is applicable to the intrinsic carrier density.

In the case of an oxide semiconductor, a thin oxide semiconductor film can be formed by a sputtering method at a heating temperature from a room temperature to 400° C. and a maximum process temperature can be set to a temperature higher than or equal to 300° C. and lower than or equal to 800° C. In the case where the maximum process temperature is set to a temperature lower than or equal to the strain point of glass, a thin oxide semiconductor film can be formed over a large-area glass substrate. Therefore, from the standpoint of industrialization, it is important to manufacture a metal oxide whose band gas is wide, employing a maximum process temperature higher than or equal to 300° C. and lower than or equal to 800° C.

Metal oxides which have been reported so far have an amorphous state, a polycrystalline state, or a single-crystalline state and are obtained through treatment at a high temperature of approximately 1500° C. However, as described above, a thin polycrystal which is c-axis-aligned can be formed at a relatively low temperature with a method in which a plate-shaped polycrystal of a metal oxide is formed and then crystal growth is performed using the plate-shaped polycrystal of the metal oxide as a seed. Further, if formation of a thicker polycrystalline film is possible, industrial application is further expanded. Note that in order to obtain a fine thick polycrystalline film, flatness and smoothness of the substrate are preferably high. This is because small unevenness of the substrate leads to local shift of the c-axis, which results in defects such as crystal transition due to a difference in the c-axis direction between adjacent crystals as crystal growth proceeds.

Note that with the use of the oxide semiconductor layer including the plate-shaped crystal layer, a transistor with high field effect mobility can be obtained. In addition, a transistor with low off current can be obtained. In addition, a so-called normally-off switching element can be obtained, so that a semiconductor device with low power consumption can be provided.

BRIEF DESCRIPTION OF DRAWINGS

In the accompanying drawings:

FIG. 15A shows a state in which a positive potential (+V$_G$) is applied to a gate (GE), and FIG. 15B shows a state in which a negative potential (−V$_G$) is applied to the gate (GE);

BEST MODE FOR CARRYING OUT THE INVENTION

Hereinafter, embodiments of the present invention will be described in detail with references to the accompanying drawings. However, the present invention is not limited to the description below, and it is easily understood by those skilled in the art that modes and details disclosed herein can be modified in various ways. Therefore, the present invention is not construed as being limited to description of the embodiments.

Embodiment 1

Figure 4A:
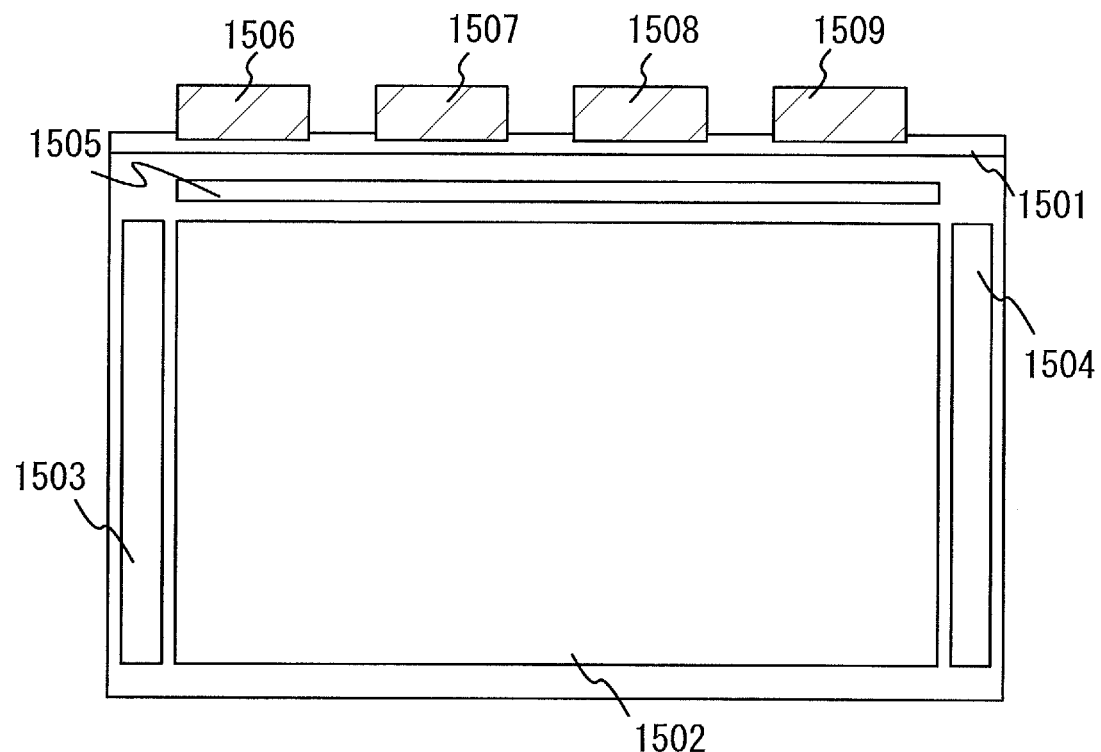
FIGS. 4A and 4B are views illustrating a display device of an embodiment of the present invention.
Figure 4B:
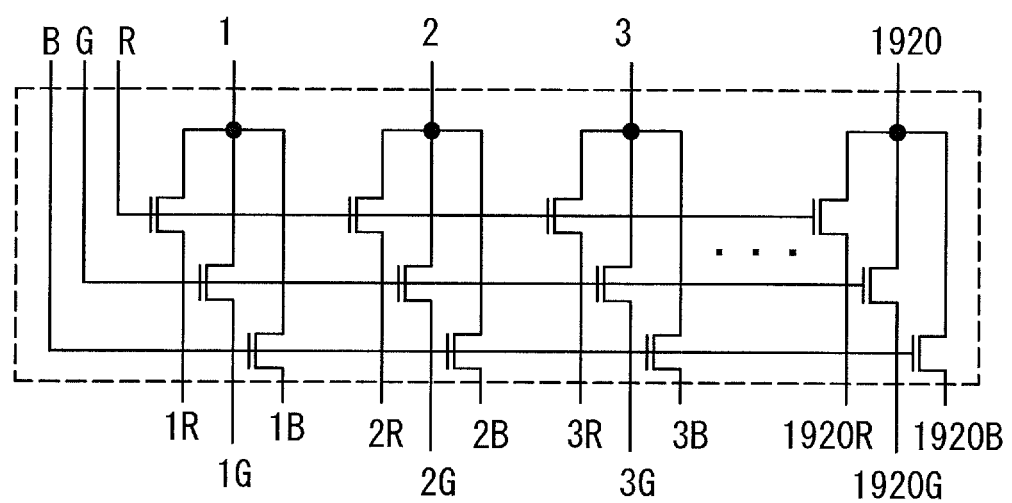

FIGS. 4A and 4B show an embodiment of the present invention. FIG. 4A illustrates a display device provided with a pixel portion 1502, gate drivers 1503 and 1504, and an analog switch 1505 for driving a source line integrated on a glass substrate 1501. The reason why the analog switch 1505 is used for driving the source line is as follows. For example, in the case of a full high-vision display device, there are 5760 (1920×RGB) source signal lines. When a source driver is not formed over the same substrate as the source signal lines, terminals of the source signal lines are each connected to a terminal of the source driver. Therefore, there is a problem in that a contact failure of a terminal easily occurs due to mechanical impact or the like. Reduction in the number of terminals is effective for less contact failure. Accordingly, an object is to reduce the number of terminals by forming an analog switch array over the same substrate as the source signal lines and selectively connecting each terminal of RGB to a source driver in a time division manner.

FIG. 4B illustrates an equivalent circuit of the analog switch 1505. In an example illustrated in FIG. 4B, 1920 output terminals of the source driver and 3 terminals controlling gates of the analog switch array bring the number of terminals connected to the outside of the display device to 1923 in total, which is approximately one third of the number of such terminals in the case where the analog switch array is not used for driving a source line. These terminals are connected to FPCs 1506, 1507, 1508, and 1509. On the other hand, as compared to the case of performing time division, the source driver connected to the analog switch needs to operate three times faster and time for writing source signal lines needs to be reduced to one third. In order to reduce time for writing source signal lines, it is important to improve current capability of transistors used for the analog switch.

Figures 5A, 5B:
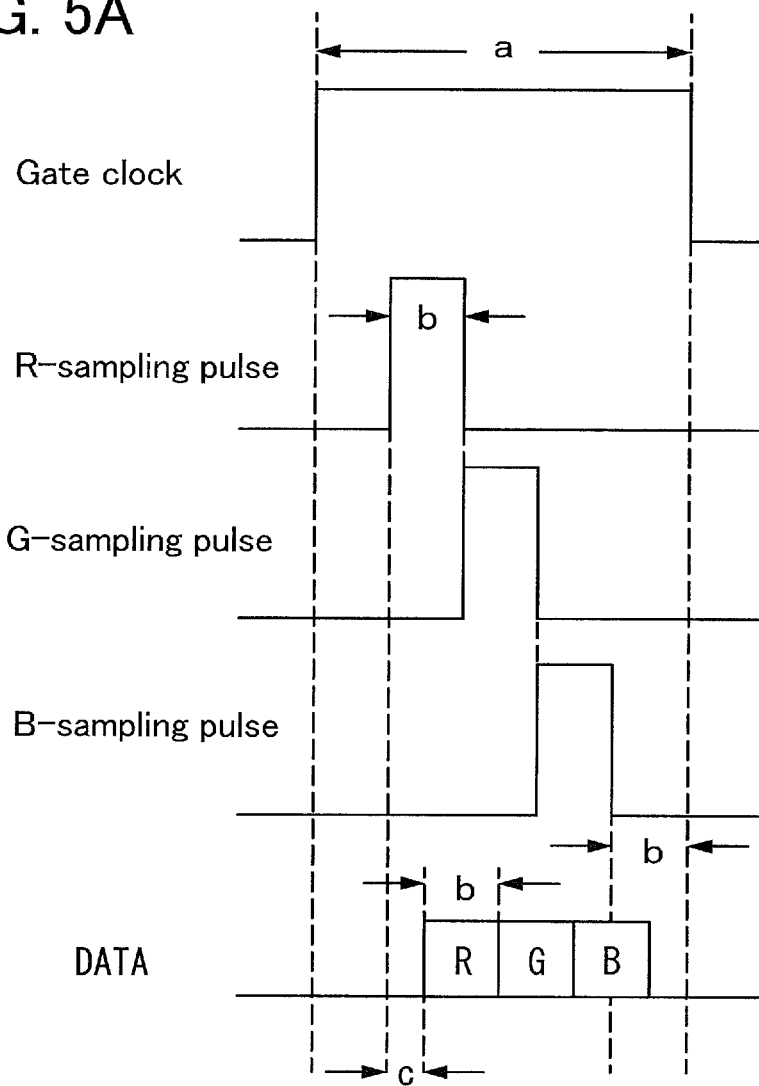
FIGS. 5A and 5B are views showing timing of a display device of an embodiment of the present invention.

FIG. 5A illustrates timing of performing time division. In the case where time division is not performed, a source line may be written in one line period. In the case where time division is performed, a source line needs to be written in one third or less of one line period. Moreover, in recent years, a double-frame-rate driving method, a quadruple-frame-rate driving method, and the like are widely used for improving characteristics of moving images in display devices. These driving methods aim to improve definitions of images by making images between frames in a television device, while television broadcasting is at normal speed. Therefore, a display device is required to operate at a double frame rate or a quadruple frame rate. FIG. 5B shows periods at a normal frame rate, a double frame rate, and a quadruple frame rate. In FIG. 5A, a pulse width "a" of a gate clock corresponds to one horizontal line period, within which a source line needs to be written. As shown in FIG. 5B, the value of "a" is 15.3 µs at a normal frame rate (a frame frequency of 60 Hz), 7.63 µs at a double frame rate (a frame frequency of 120 Hz), and 3.81 µs at a quadruple frame rate (a frame frequency of 240 Hz).

The display device needs to complete writing of a source line within these writing periods. By improvement of a mobility of a transistor including an oxide semiconductor, these can be satisfied. The "display device" here means a display device including a transistor, such as a liquid crystal display device, an organic EL display device, or electric paper.

Embodiment 2

Figure 6A:
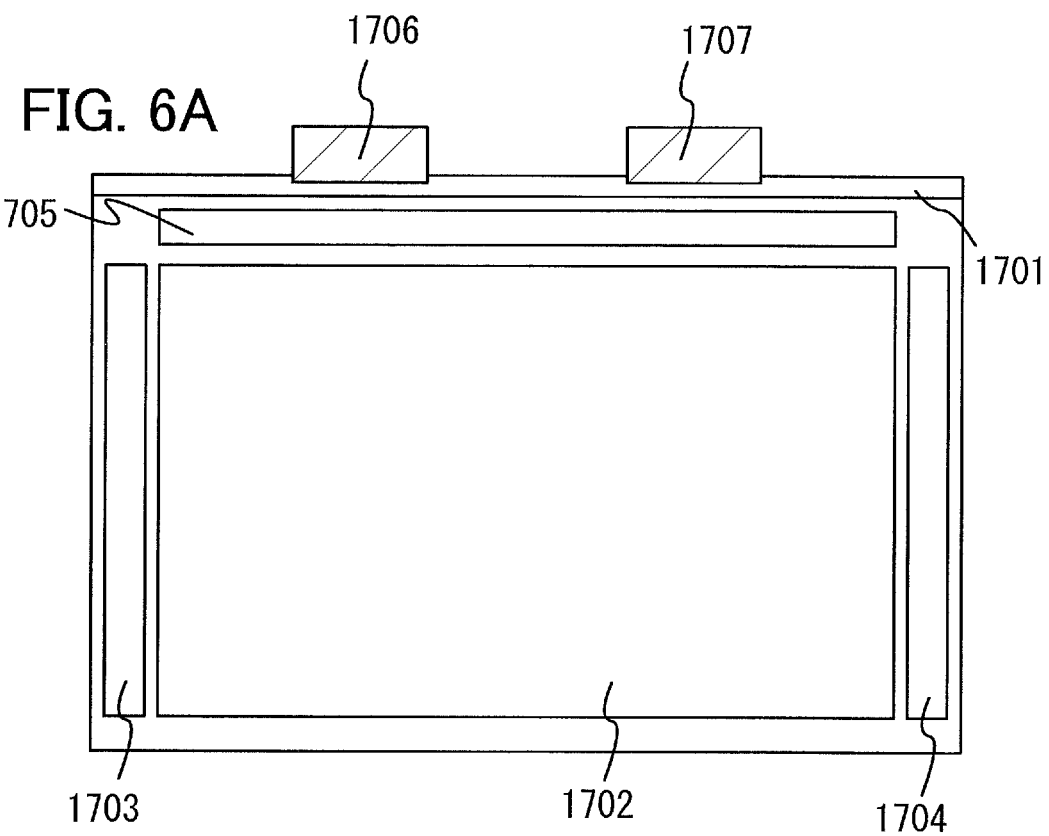
FIGS. 6A and 6B are views each illustrating a display device of an embodiment of the present invention.
Figure 6B:
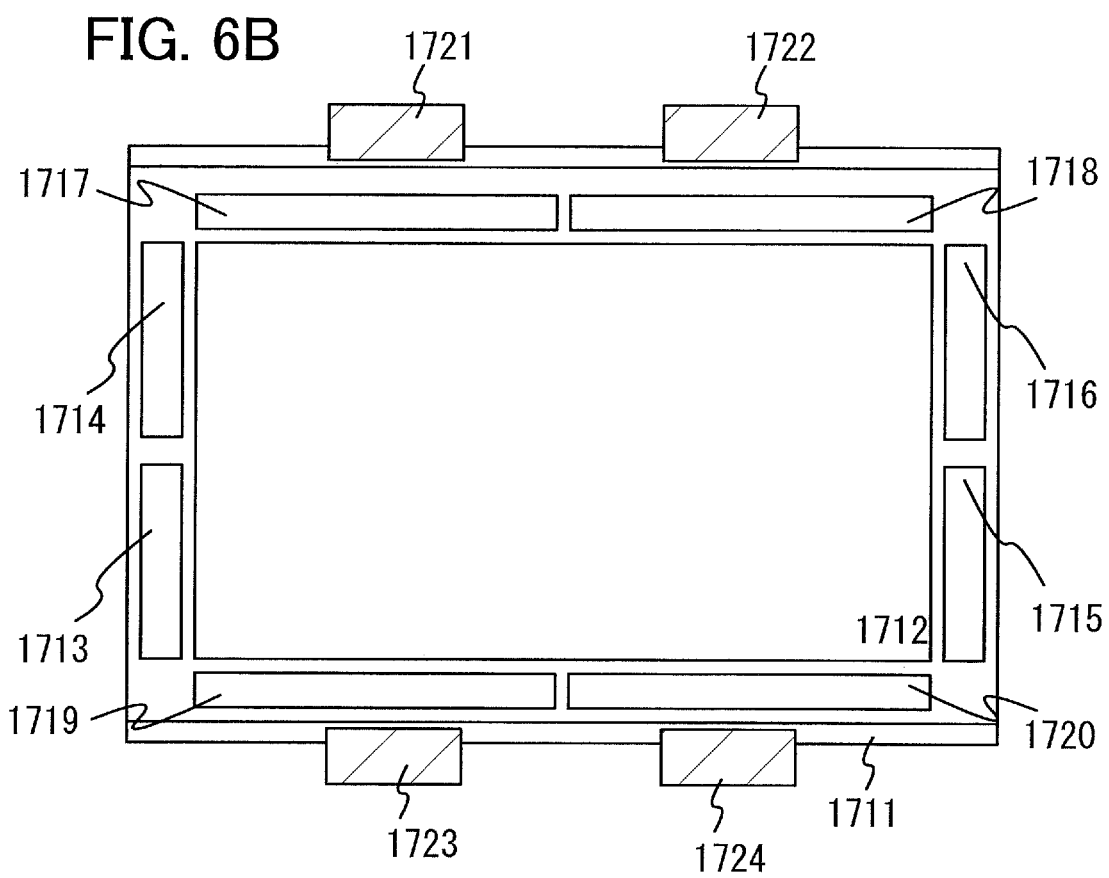

FIGS. 6A and 6B each illustrate an embodiment of a display device provided with a source driver. FIG. 6A illustrates an example in which a pixel portion 1702, gate drivers 1703 and 1704, and a source driver 1705 are provided over a glass substrate 1701. The gate drivers 1703 and 1704 and the source driver 1705 are supplied with signals from FPCs 1706 and 1707. A left side and a right side of the display device are provided with the gate driver 1703 and the gate driver 1704, respectively, and a pixel is driven; thus, driving can be performed with half of driving capability as compared to the case where a gate driver is provided on only one side.

FIG. 6B illustrates an example in which, over a glass substrate 1711, a pixel portion 1712, gate drivers 1713, 1714, 1715, and 1716 on an upper side and a lower side of a display device, and source drivers 1717, 1718, 1719, and 1720 on a left side and a right side of the display device are provided. The gate drivers and the source drivers are supplied with signals from FPCs 1721, 1722, 1723, and 1724. With such an arrangement, display can be performed as long as each driver has driving capability for driving only one fourth of the display device. In the case of a full high-definition display device, the display device can be driven with drivers each having capability of driving a QHD (quarter high definition) display device. Therefore, according to the present invention, it is possible for a full high-definition display device with a size of approximately 100 inches to drive at a double frame rate with a transistor including an oxide semiconductor, whose field effect mobility is improved to higher than or equal to 50 cm$^2$/Vs, preferably 100 cm$^2$/Vs.

Embodiment 3

Calculation results in the case where an analog switch is used for driving a source line are show below. The calculation is made in the case of a 100-inch liquid crystal display device with a frame frequency of 240 Hz (quadruple frame rate). As described above, a source line needs to be written within 0.7 µs at a quadruple frame rate. At this time, a transistor used for the analog switch for sampling has L/W=3 µm/1500 µm, a field effect mobility of 100 cm$^2$/Vs, and a threshold voltage of 1.5 V. A source signal line has a sheet resistance of 0.01 Ω/square, a resistance of 2.08 KΩ, a capacity of 18.5 pF, and a line width of 6 µm. An aim is to perform writing until a source line potential reaches 99.9% of an expected value.

Figure 7:
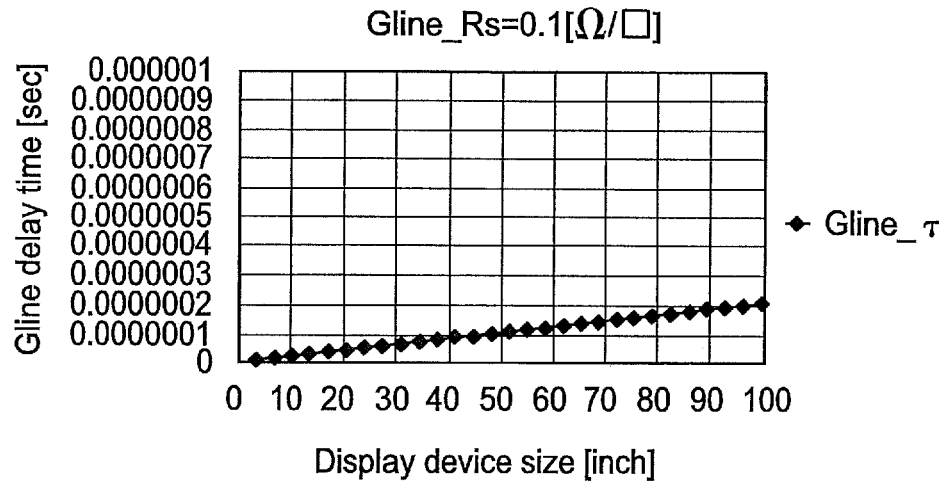
FIG. 7 shows a relation between rise time of a gate line and a size of a display device.

FIG. 7 shows a relation between rise time of a gate line and a size of a display device. When the maximum delay time of the gate wiring is set to 0.5 µs, the delay time of the gate line can satisfy the requirement even with a 100-inch display device. In this calculation, the sheet resistance of the gate line is 0.1 Ω/square, the capacity is 41.3 pF, and the line width is 23 µm.

Figure 8:
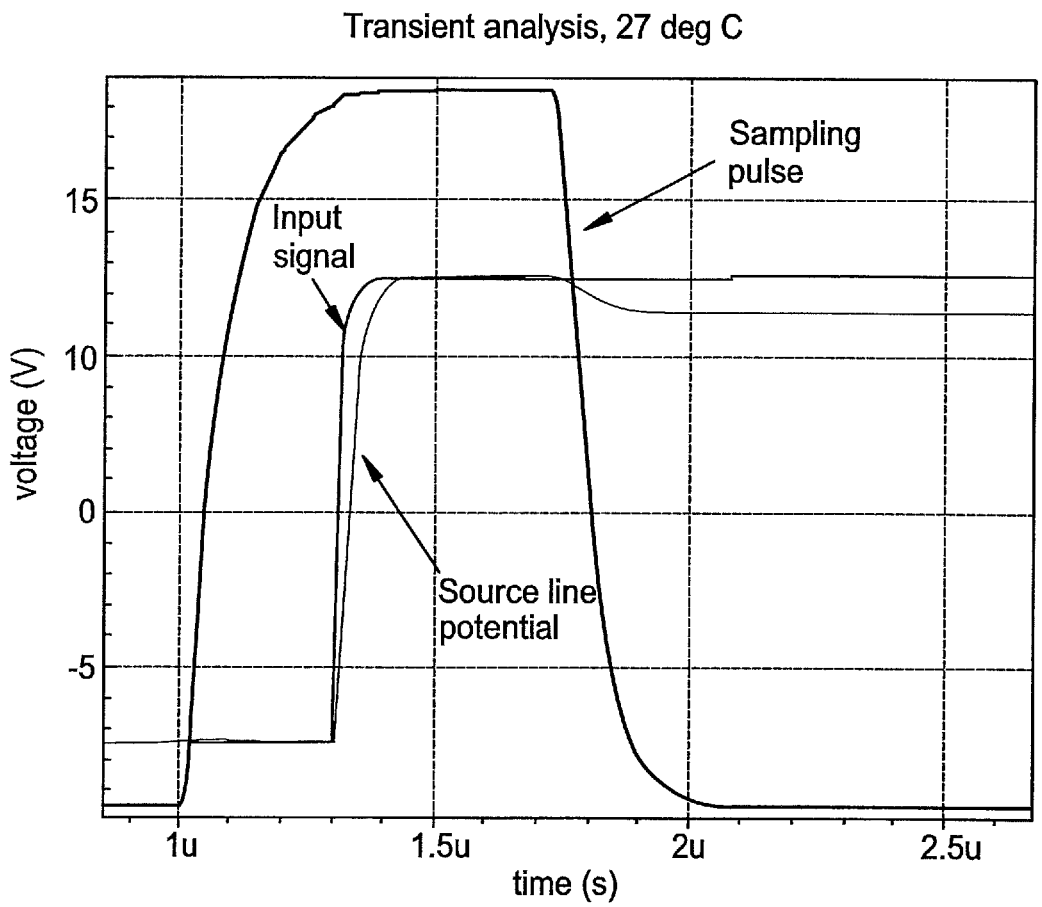
FIG. 8 shows writing of a source line.

FIG. 8 shows the calculation result of writing of a source line. Writing is performed while a sampling pulse is high, and operation is performed so that a potential of an input signal and a potential of the written source line become close. FIG. 8 shows a potential of the sampling pulse, a potential of the input signal, and a potential of the point of the source line whose potential has the biggest difference with the input signal. As shown in FIG. 8, 99.9% of writing of the potential of the source line can be completed in 0.2 µs after rising of the input signal. Thus, a 100-inch full high-definition display device, which incorporates an analog switch for driving a source line, can be driven at quadruple frame rate by improving a mobility of a transistor including an oxide semiconductor. Although calculation is made with a 100-inch display device here, the size of the display device is not limited to this. A display device with a size of 100 inches or smaller is acceptable. Moreover, a display device with a size of 100 inches or larger is acceptable with further improvement in a field effect mobility and reduction in wiring resistance.

Embodiment 4

Figure 9:
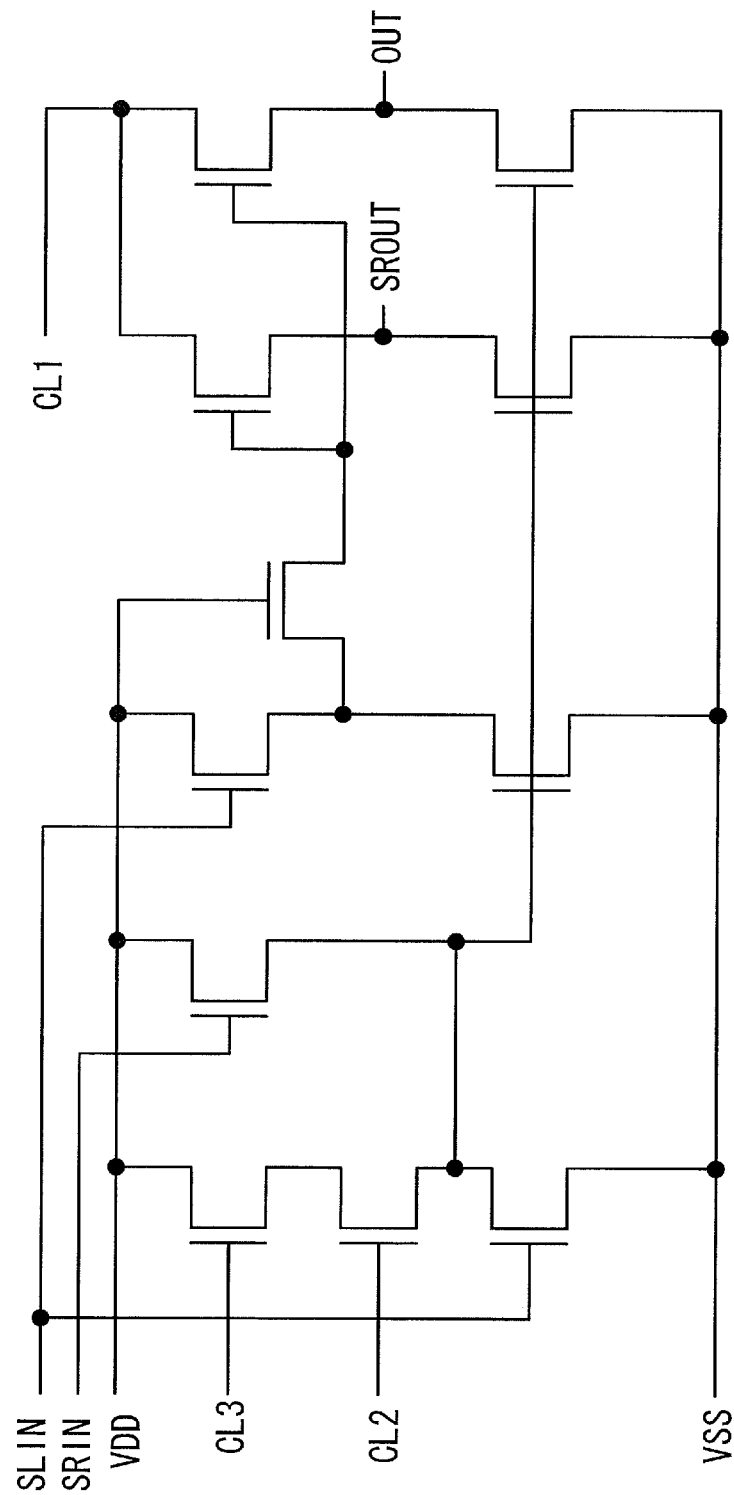
FIG. 9 is a view illustrating an embodiment of a shift register.
Figures 10A, 10B:
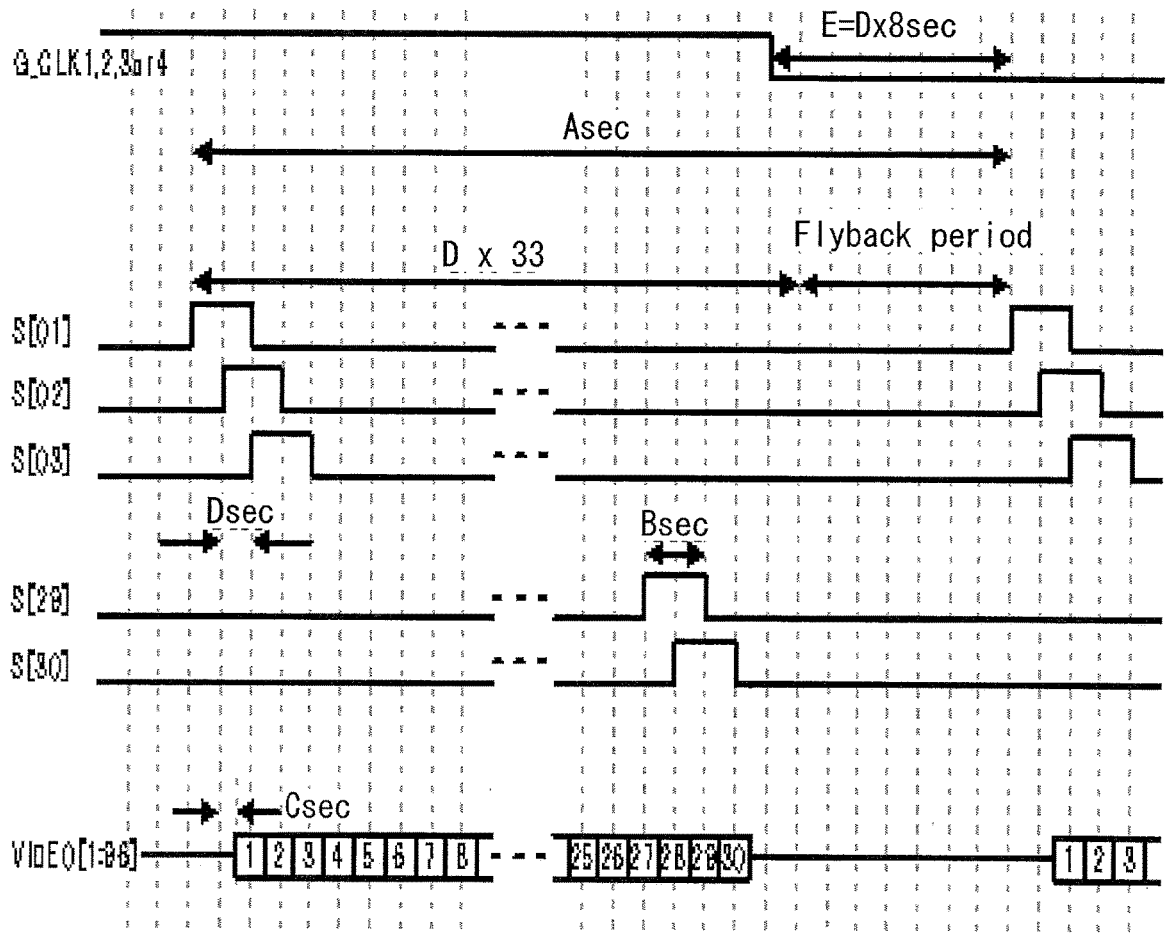
FIGS. 10A and 10B show timing of a shift register.

A calculation result in the case where a shift register is used as a source driver for driving a source line is explained. A set/reset shift register illustrated in FIG. 9 is used. Further, the calculation is made on the assumption that the source drivers are arranged as illustrated in FIG. 6B. The sampling is performed for 960 shift registers at a time. One quarter of a region of a full high-definition display device is written by one source driver, so that points to be sampled are 960× RGB=2880. The number of stages of shift registers required for sampling the 960 shift registers at a time is 30 stages. FIG. 10A shows a timing chart of this case. FIG. 10B shows periods set in accordance with FIG. 10A. The clock frequency of the source driver corresponds to the inverse of the double of the time period B shown in FIG. 10B.

The clock frequency needed for driving the display device is as follows: 579 kHz in the case of driving at a normal frame rate; 1.15 MHz in the case of driving at a double frame rate; and 2.31 MHz in the case of driving at a quadruple frame rate. The shift registers can operate under the above condition only when field effect mobility is 100 cm$^2$/Vs. In this case, allowable time for writing a source line is as follows: 0.43 µs at a normal frame rate; 0.22 µs at a double frame rate; and 0.11 µs at a quadruple frame rate. This is enough for a capability of a source driver, but the delay time of the source driver is a problem. In the case of a 100-inch display device, actual driving corresponds to the case of a 50-inch display device; accordingly, conditions of the source line at this time are as follows: the sheet resistance of the source signal line is 0.01 Ω/square; the resistance of the source line is 1.04 KΩ; the capacitance of the source line is 9.3 pF; and the line width is 20 µm.

Figure 11:
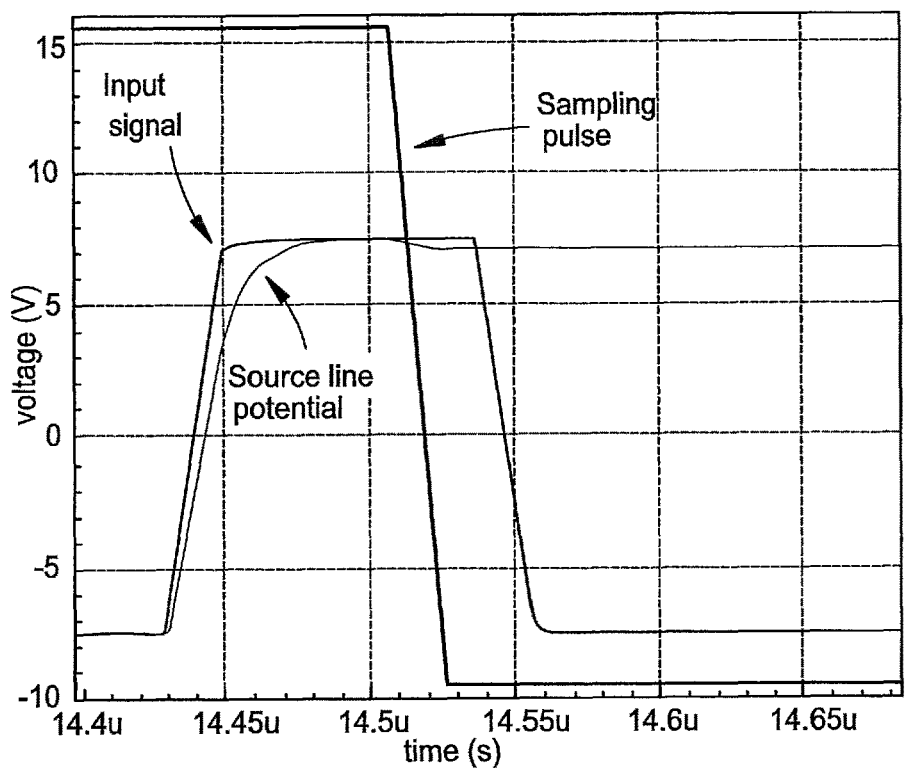
FIG. 11 shows writing of a source line.

FIG. 11 shows the delay time of the source line. In the case of a 100-inch display device, the wiring delay is 30 ns; therefore, writing needs to be completed within approximately 60% of the allowable time. Accordingly, it is difficult for the 100-inch display device to perform writing. FIG. 11 shows data of a 10-inch display device with the frame frequency at a quadruple frame rate. Here, a potential of a sampling pulse, a potential of an input signal, and a potential of a point of the source line, whose potential has the biggest difference with the input signal are shown. Writing is performed in a period when the sampling pulse is high and operation is performed so that the potential of the input signal is equal to the potential of the source line. The potential of the input signal reaches 99.9% of its maximum in approximately 0.07 µs after rising of the input signal, which indicates that a 10-inch display device can operate at a quadruple frame rate.

Figure 12:
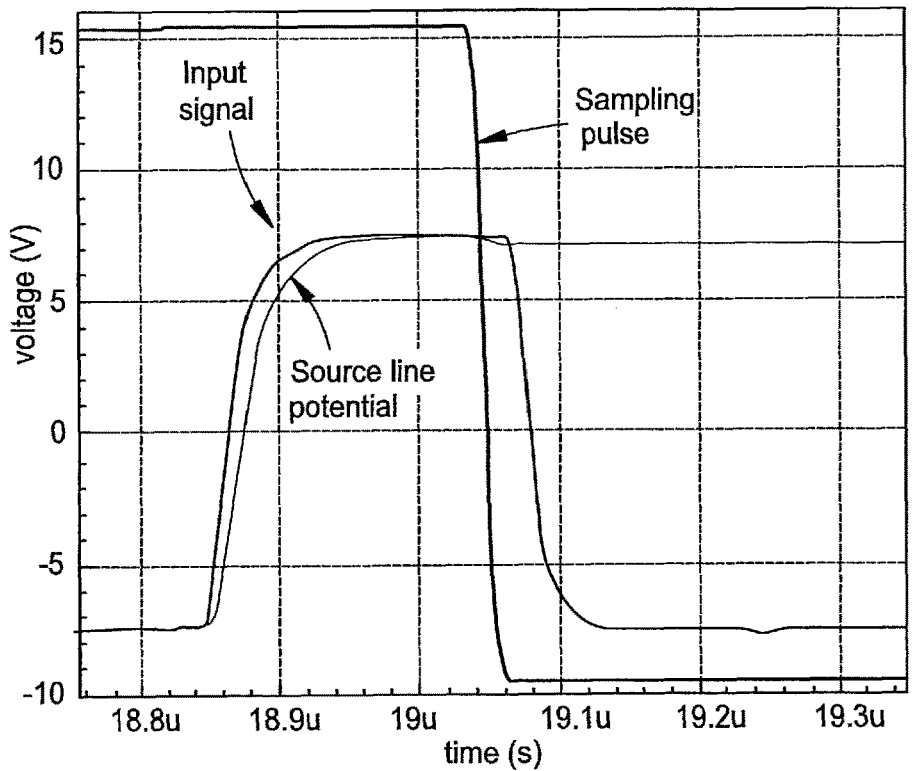
FIG. 12 shows writing of a source line.

FIG. 12 shows a calculation result in the case where the frame frequency is 120 Hz at double speed and the size of a display device is 100 inches. Conditions other than the frequency are the same as the above. Here, a potential of a sampling pulse, a potential of an input signal, and a potential of a point of the source line, whose potential has the biggest difference with the input signal are shown. Writing is performed in a period when the sampling pulse is high and operation is performed so that the potential of the input signal is equal to the potential of the source line. The potential of the input signal reaches 99.9% of its maximum in approximately 0.13 µs after rising of the input signal. In this case, this indicates that 99.9% of writing can be performed within allowable time even with a 100-inch display device. Thus, with a mobility of 100 cm$^2$/Vs, a display device even with a display size of 100 inches can operate at a double frame rate with source drivers incorporated.

Embodiment 5

In this embodiment, an example of process for manufacturing a transistor will be described with reference to FIG. 1A to 1C, FIGS. 2A to 2E, and FIGS. 3A and 3B.

First, a conductive film is formed over a substrate 400 which is a substrate having an insulating surface, and then a gate electrode layer 401 is provided using a photolithography step with the use of a photomask.

As the substrate 400, a glass substrate which enables mass production is preferably used, in particular. As a glass substrate used for the substrate 400, a glass substrate whose strain point is higher than or equal to 730° C. may be used when the temperature of the heat treatment to be performed in a later step is high. For the substrate 400, for example, a glass material such as aluminosilicate glass, aluminoborosilicate glass, or barium borosilicate glass is used. Note that by containing a larger amount of barium oxide (BaO) than boron oxide, a heat-resistant glass substrate which is of more practical use can be formed. Therefore, a glass substrate which contains BaO and $B_2O_3$ so that the amount of BaO is larger than that of $B_2O_3$ is preferably used.

An insulating layer serving as a base layer may be provided between the substrate 400 and the gate electrode layer 401. The base layer has a function of preventing diffusion of an impurity element from the substrate 400, and can be formed with a single-layer or a stacked-layer structure using one or more of a silicon nitride layer, a silicon oxide layer, a silicon nitride oxide layer, and a silicon oxynitride layer.

A metal conductive layer can be used as the gate electrode layer 401. As the material of the metal conductive layer, an element selected from Al, Cr, Cu, Ta, Ti, Mo, and W, an alloy containing any of these elements as a component, an alloy containing any of these elements in combination, or the like is preferably used. For example, a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer is preferable. Needless to say, the metal conductive layer may have a single-layer structure, a two-layer structure, or a structure in which four or more layers are stacked. In the case where heat treatment is performed later, a material which can withstand a temperature of the heat treatment is preferably selected for the gate electrode layer 401.

Next, a gate insulating layer 402 is formed over the gate electrode layer 401. The gate insulating layer 402 can be formed to have a single layer of a silicon oxide layer, a silicon nitride layer, a hafnium oxide layer, a silicon oxynitride layer, or a silicon nitride oxide layer, or a stacked layer thereof by a plasma CVD method, a sputtering method, or the like. For example, a stack including a silicon nitride film and a silicon oxide film is used. The thickness of the gate insulating layer 402 is greater than or equal to 50 nm and less than or equal to 200 nm.

In this embodiment, the gate insulating layer 402 is formed using a high-density plasma apparatus. Here, a high-density plasma apparatus refers to an apparatus which can realize a plasma density higher than or equal to $1 \times 10^{11}/cm^3$. For example, plasma is generated by applying a microwave power higher than or equal to 3 kW and lower than or equal to 6 kW so that the insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that the insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

In forming the gate insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed using the high-density plasma apparatus can have certain thickness, the insulating film has excellent step coverage. Further, as for the insulating film formed using the high-density plasma apparatus, the thickness of a thin film can be controlled precisely.

The insulating film formed through the above process procedure is greatly different from an insulating film formed using a conventional parallel plate PCVD apparatus. The etching rate of the insulating film formed through the above process procedure is lower than that of the insulating film formed using the conventional parallel plate PCVD apparatus by 10% or more or 20% or more in the case where the etching rates with the same etchant are compared to each other. Thus, it can be said that the insulating film formed using the high-density plasma apparatus is a dense film.

In this embodiment, a silicon oxynitride film (also referred to as $SiO_xN_y$, where $x>y>0$) with a thickness of 100 nm formed using the high-density plasma apparatus is used as the gate insulating layer 402.

Then, a first oxide semiconductor layer with a thickness greater than or equal to 2 nm and less than or equal to 15 nm is formed over the gate insulating layer 402. The first oxide semiconductor layer can be formed by a sputtering method in a rare gas (typically, argon) atmosphere, an oxygen atmosphere, or a mixed atmosphere including a rare gas (typically, argon) and oxygen.

In addition, it is preferable that moisture or the like which remains in the sputtering apparatus be removed before, during, or after deposition of the oxide semiconductor film. In order to remove residual moisture in the sputtering apparatus, an adsorption-type vacuum pump may be used. Examples of pumps that can be used comprise a cryopump, an ion pump, or a titanium sublimation pump. The evacuation unit can be a turbo pump provided with a cold trap. In the sputtering apparatus which is evacuated with the cryopump, a hydrogen atom, a compound containing a hydrogen atom, such as water ($H_2O$), and the like are removed, whereby the concentration of an impurity in the oxide semiconductor film formed in the deposition chamber can be reduced.

In this embodiment, the first oxide semiconductor layer with a thickness of 5 nm is formed in an oxygen atmosphere, an argon atmosphere, or a mixed atmosphere of argon and oxygen in the following conditions: an oxide semiconductor target (an In—Ga—Zn—O-based oxide semiconductor target ($In_2O_3:Ga_2O_3:ZnO=1:1:2$ [molar ratio], that is, In:Ga:Zn=1:1:1 [atomic ratio])) is used, the distance between the substrate and the target is 170 mm, pressure is 0.4 Pa, and a direct current (DC) power source is 0.5 kW. Alternatively, as the oxide semiconductor target, a target having a composition ratio of In:Ga:Zn=1:1:0.5 [atomic ratio] or In:Ga:Zn=1:1:2 [atomic ratio] can be used. In this embodiment, since crystallization is intentionally caused by performing heat treatment in a later step, it is preferable to use a target of an oxide semiconductor in which crystallization is easily caused.

In addition, an oxide semiconductor contained in the target for an oxide semiconductor has a relative density of 80% or more, preferably 95% or more, more preferably 99.9% or more. The impurity concentration in the oxide semiconductor film which is formed using the target having high relative density can be reduced, and thus a transistor having excellent electric characteristics or high reliability can be obtained.

Further, pre-heat treatment is preferably performed before the first oxide semiconductor layer is deposited, in order to remove moisture or hydrogen which remains on an inner wall of a sputtering apparatus, on a surface of the target, or inside a target material. As the pre-heat treatment, a method in which the inside of the deposition chamber is heated to higher than or equal to 200° C. and lower than or equal to 600° C. under reduced pressure, a method in which introduction and exhaust of nitrogen or an inert gas are repeated while the inside of the deposition chamber is heated, and the like can be given.

Next, the first oxide semiconductor layer is subjected to first heat treatment, so that at least part thereof is crystallized. In the first heat treatment, a temperature higher than or equal to 450° C. and lower than or equal to 850° C. is employed. In addition, heating time is longer than or equal to 1 minute and shorter than or equal to 24 hours. By the first heat treatment, a first oxide semiconductor layer 403 that is a polycrystalline layer obtained by crystal growth proceeding from a surface is formed (see FIG. 2A). Further, the crystal layer formed at the surface has a surface parallel to an a-b plane and a c-axis aligned perpendicularly to the surface of the crystal layer. In this embodiment, an example is described in which the whole first oxide semiconductor film is made to contain a crystal (also referred to as a co-growing (CG) crystal) by the first heat treatment.

Note that in the first heat treatment, it is preferable that water, hydrogen, and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be 6N or more, more preferably 7N or more. Further, the first heat treatment may be performed in a dry air atmosphere with an $H_2O$ concentration of lower than or equal to 20 ppm.

In this embodiment, heat treatment in a dry air atmosphere at 700° C. for one hour is performed as the first heat treatment.

In addition, when the temperature is increased in the first heat treatment, the inside of a furnace may be set to a nitrogen atmosphere, and when cooling is performed, the inside of the furnace may be switched to an oxygen atmosphere. By performing dehydration or dehydrogenation in a nitrogen atmosphere and switching the atmosphere to an oxygen atmosphere, oxygen can be supplied into the first oxide semiconductor layer, so that an i-type oxide semiconductor layer can be obtained.

Figure 2A:
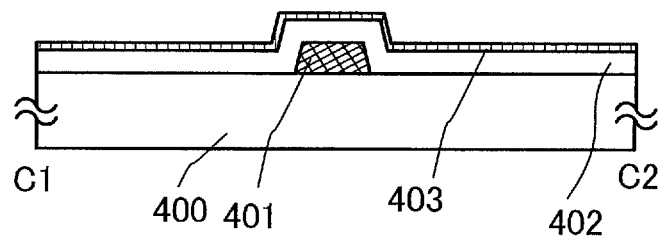
FIGS. 2A to 2E are cross-sectional views illustrating manufacturing steps of an embodiment of the present invention.
Figure 2B:
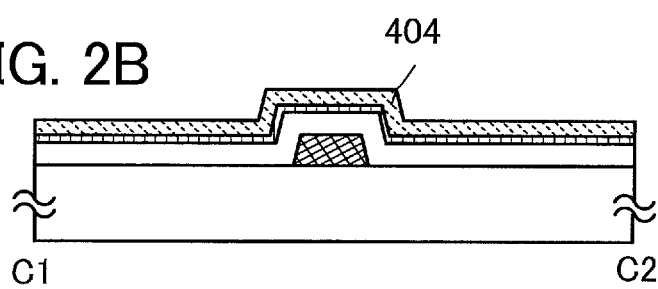

Next, a second oxide semiconductor layer 404 whose thickness is larger than at least that of the first oxide semiconductor layer 403 and less than or equal to 10 μm is formed over the first oxide semiconductor layer 403 that is a plate-shaped polycrystal (see FIG. 2B). Note that a thickness of the second oxide semiconductor layer 404 suitable for a device to be manufactured may be determined appropriately by practitioners. For example, in the case of manufacturing a bottom-gate transistor, the total thickness of the first oxide semiconductor layer 403 and the second oxide semiconductor layer 404 may be greater than or equal to 10 nm and less than or equal to 200 nm.

As the second oxide semiconductor layer 404, a four-component metal oxide film such as an In—Sn—Ga—Zn—O film, a three-component metal oxide film such as an In—Ga—Zn—O film, an In—Sn—Zn—O film, an In—Al—Zn—O film, a Sn—Ga—Zn—O film, an Al—Ga—Zn—O film, or a Sn—Al—Zn—O film, a two-component metal oxide film such as an In—Zn—O film, a Sn—Zn—O film, an Al—Zn—O film, a Zn—Mg—O film, a Sn—Mg—O film, or an In—Mg—O film, or an In—O film, a Sn—O film, or a Zn—O film can be used.

It is preferable that the first oxide semiconductor layer 403 and the second oxide semiconductor layer 404 be formed using materials including the same components or have the same crystal structures and lattice constants close to each other (mismatch less than or equal to 1%). In the case where the materials including the same components are used, crystal growth with the use of the polycrystalline layer of the first oxide semiconductor layer 403 as a seed is easily performed during the subsequent crystallization step. In addition, in the case where the materials including the same components are used, an interface property such as adhesion or electric characteristics is favorable.

Next, second heat treatment is performed, so that crystal growth is performed using the crystal layer of the first oxide semiconductor layer 403 as a seed. The second heat treatment is performed at a temperature higher than or equal to 450° C. and lower than or equal to 850° C., preferably higher than or equal to 550° C. and lower than or equal to 650° C.

In addition, heating time is longer than or equal to 1 minute and shorter than or equal to 24 hours. By the second heat treatment, the second oxide semiconductor layer is crystallized. In this manner, a plate-shaped crystallized oxide semiconductor stack 430 can be obtained (see FIG. 2C).

A plate-shaped crystal is preferably a single crystal which is c-axis-aligned in a direction perpendicular to a surface of the oxide semiconductor layer. If the plate-shaped crystal is not a single crystal body, then the plate-shaped crystal is preferably a polycrystal in which the a-axis and the b-axis of each crystal are aligned in a channel formation region and is c-axis-aligned in a direction perpendicular to a surface of the oxide semiconductor layer. Note that in the case where a surface of the base of the oxide semiconductor layer is uneven, the plate-shaped crystal is a polycrystal.

Figure 1A:
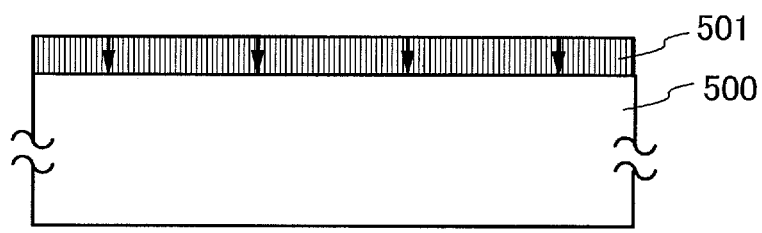
FIGS. 1A to 1C are cross-sectional views illustrating an embodiment of the present invention.
Figure 1B:
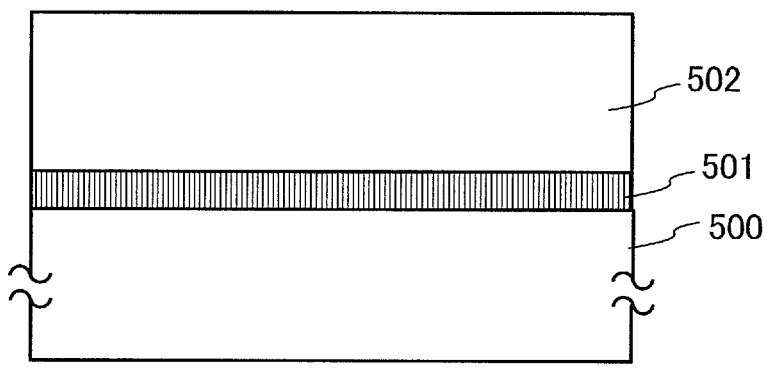
Figure 1C:
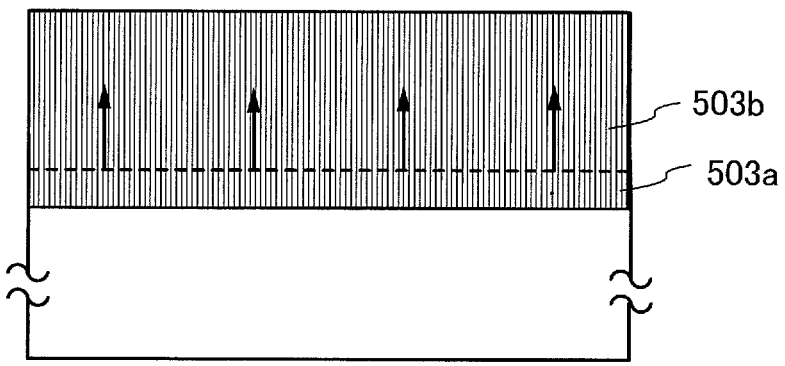
Figure 2C:
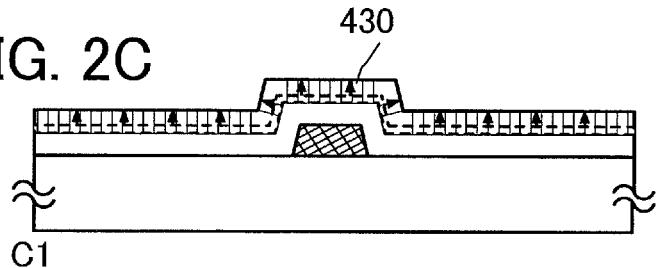

In order to describe a superordinate concept to easily understand steps of FIGS. 2A, 2B, and 2C, magnified schematic views are illustrated in FIGS. 1A, 1B, and 1C.

FIG. 1A illustrates a first oxide crystal component 501 which has been subjected to first heat treatment for crystallization over a base component 500. FIG. 1A corresponds to FIG. 2A and the base component 500 corresponds to the gate insulating layer 402. FIG. 1B corresponds to FIG. 2B and is a cross-sectional view at the time just after deposition of a second oxide semiconductor layer 502. FIG. 1C corresponds to FIG. 2C and is a cross-sectional view at the time after second heat treatment. By the second heat treatment, a third oxide crystal component 503a formed of a crystal layer whose crystal direction is highly aligned is obtained. In the case where the first oxide component and the second oxide component are formed using the oxide semiconductor materials including the same components, as illustrated in FIG. 1C, crystal growth proceeds upward toward a surface of the second oxide component with the use of a crystal layer of the third oxide crystal component 503a as a nucleus, and a second oxide crystal component 503b is formed, so that all the crystal components are aligned along their c-axis. Therefore, a boundary between the third oxide crystal component and the second oxide crystal component is unclear as illustrated with a dotted line in FIG. 1C. In addition, by the second heat treatment, the inside of the second oxide component which has just been deposited is highly purified to be layer including an amorphous oxide semiconductor.

Figure 2D:
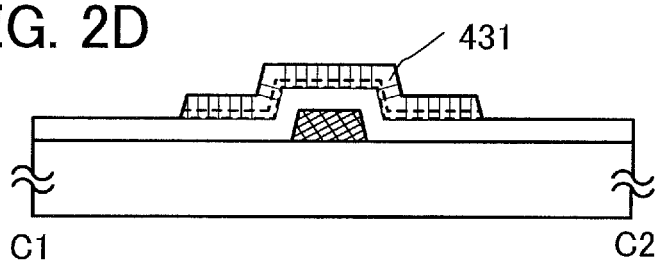

Next, the oxide semiconductor stack 430 formed from the first oxide semiconductor layer and the second oxide semiconductor layer is processed into an island-shaped oxide semiconductor stack 431 using a photolithography step (see FIG. 2D). Further, a resist mask for forming the island-shaped oxide semiconductor stack 431 may be formed using an inkjet method. Formation of the resist mask by an inkjet method needs no photomask; thus, manufacturing cost can be reduced.

Next, after a metal conductive film is formed over the gate insulating layer 402 and the island-shaped oxide semiconductor stack 431 by a sputtering method or the like, photolithography step is performed so that a resist mask is formed. Then, the metal conductive film is selectively etched, so that metal electrode layers are formed.

As the material of the metal conductive film, which is to be a source electrode and a drain electrode (including a wiring formed using the same layer), a metal material such as Al, Cu, Cr, Ta, Ti, Mo, or W; or an alloy material whose main component is any of these metal materials is used. In addition, a structure in which a layer of a high-melting-point metal such as Cr, Ta, Ti, Mo, or W is stacked on a lower side and/or an upper side of a metal layer of Al, Cu, or the like may be used. In addition, heat resistance can be improved by using an Al material to which an element such as Si, Ti, Ta, W, Mo, Cr, Nd, Sc, or Y which prevents generation of a hillock or a whisker in an Al film is added.

For example, the metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked, a two-layer structure in which a copper layer and a tungsten layer are stacked, or a two-layer structure in which an aluminum layer and a molybdenum layer are stacked. Needless to say, the metal conductive film may have a single-layer structure or a stacked-layer structure including four or more layers.

Then, the resist mask is removed, and a photolithography step is performed. A resist mask is formed and selective etching is performed, so that a source electrode layer 405a and a drain electrode layer 405b are formed. After that, the resist mask is removed (see FIG. 2E). Note that in this photolithography step, in some cases, part of the island-shaped oxide semiconductor stack 431 is etched, whereby an oxide semiconductor layer having a groove (a depression portion) is formed.

Figure 2E:
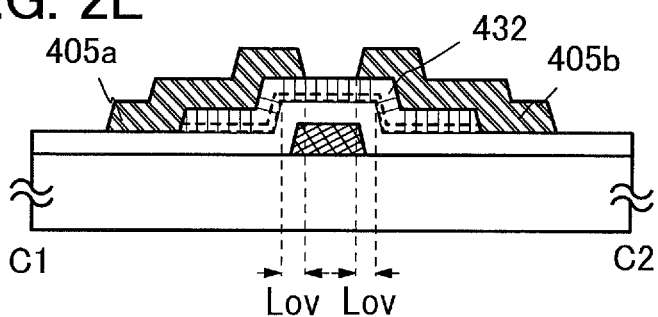

As illustrated in FIG. 2E, the gate electrode layer 401 includes a region overlapping with the source electrode layer 405a (and the drain electrode layer 405b), which is also one feature. A region between an edge portion of the source electrode layer 405a and a step of the gate insulating layer 402, in other words, a region between the edge portion of the source electrode layer 405a and a point at which a flat surface is changed to a tapered surface of the gate insulating layer in the cross-sectional view (here, an $L_{OV}$ region in FIG. 2E) is included. The $L_{OV}$ region is important in order that carriers are prevented from flowing to a crystal grain boundary generated due to the step of the edge portion of the gate electrode layer.

In addition, in a side surface of the oxide semiconductor stack 432, a crystal layer which is in contact with the source electrode layer 405a or the drain electrode layer 405b is in an amorphous state in some cases.

Further, a resist mask used for forming the source electrode layer 405a and the drain electrode layer 405b may be formed by an inkjet method. Formation of the resist mask by an inkjet method needs no photomask; thus, manufacturing cost can be reduced.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, an oxide insulating layer 407 serving as a protective insulating film is formed in contact with part of the oxide semiconductor layer.

The oxide insulating layer 407 can be formed to a thickness of at least 1 nm by a method by which impurities such as water and hydrogen do not enter the oxide insulating layer 407, such as a sputtering method, as appropriate. In this embodiment, a 300-nm-thick silicon oxide film is deposited as the oxide insulating layer 407 by a sputtering method. The substrate temperature in deposition may be higher than or equal to room temperature and lower than or equal to 300° C. In this embodiment, the substrate temperature is 100° C. The deposition of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with the use of a silicon target, silicon oxide can be formed by a sputtering method in an atmosphere of oxygen and nitrogen. As the oxide insulating layer 407 which is formed so as to be in contact with the oxide semiconductor layer whose resistance is reduced, an inorganic insulating film is used. Typically, a silicon oxide film, a silicon nitride oxide film, an aluminum oxide film, or an aluminum oxynitride film is used. Further, a protective insulating layer such as a silicon nitride film or an aluminum nitride film may be formed over the oxide insulating layer 407.

Further, a contact hole reaching the gate electrode layer 401 is formed in the oxide insulating layer 407 and the gate insulating layer 402, and a connection electrode which is electrically connected to the gate electrode layer 401 and supplies a gate potential to the gate electrode layer 401 may be formed over the oxide insulating layer 407. Alternatively, the following may be employed: a contact hole reaching the gate electrode layer 401 is formed after formation of the gate insulating layer 402; a connection electrode is formed thereover using the same material as that of the source electrode layer and the drain electrode layer; the oxide insulating layer 407 is formed over the connection electrode; a contact hole reaching the connection electrode is formed in the oxide insulating layer 407; and then, an electrode which is electrically connected to the connection electrode and supplies a gate potential to the connection electrode is formed over the oxide insulating layer 407.

Figure 3A:
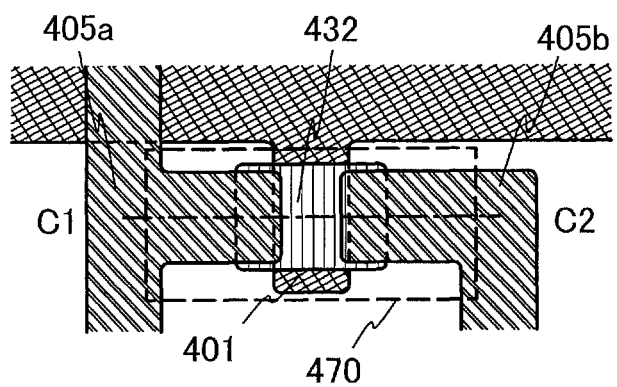
FIGS. 3A and 3B are a top view and a cross-sectional view of an embodiment of the present invention.
Figure 3B:
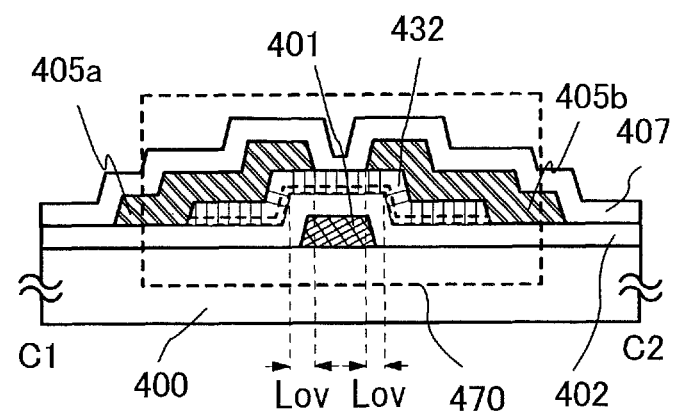

Through the above process, a transistor 470 is formed (see FIG. 3B). FIG. 3A illustrates an example of a top view of the transistor 470. Note that FIG. 3B corresponds to a cross-sectional view taken along a broken line C1-C2 in FIG. 3A.

One of features of the transistor 470 is that a top surface of the gate electrode layer which overlaps with the channel formation region is flat, an oxide component which is c-axis-aligned perpendicularly to the flat surface is included, and the source electrode layer or the drain electrode layer overlaps with the step generated due to the edge portion of the gate electrode layer. In the case where there is a projection portion and a recessed portion on the substrate side, in the oxide component (the oxide semiconductor stack 432 in this embodiment), a region in which crystal growth meets the recessed portion becomes polycrystals having a crystal boundary. Accordingly, by forming the $L_{OV}$ region illustrated in FIG. 3B, carriers can be prevented from flowing to the crystal boundary generated in unevenness of the edge portion of the gate electrode layer. Therefore, in the transistor 470, the source electrode layer or the drain electrode layer is provided over part of the flat portion of the gate electrode layer, so that the source electrode layer or the drain electrode layer includes a region overlapping with the gate electrode layer.

Needless to say, this embodiment is not particularly limited to the structure of the transistor 470 illustrated in FIG. 3B. A top gate transistor or a bottom gate transistor may be employed. For example, in order to prevent etching damage at the time of formation of the source electrode layer and the drain electrode layer in FIG. 2E, a channel-stop structure in which an oxide insulating layer overlapping with a channel formation region is formed as a channel stopper may be employed for the transistor.

In addition, an electrode layer which can function as a back gate may be provided over the oxide insulating layer 407. The potential of the back gate can be a fixed potential, e.g., 0 V, or a ground potential, and may be determined as appropriate by practitioners. Further, by controlling gate voltage applied to the back gate, threshold voltage can be controlled. Alternatively, when the threshold voltage is set positive, the transistor can function as an enhancement type transistor. Further alternatively, when the threshold voltage is set negative, the transistor can function as a depletion type transistor. For example, an inverter circuit including a combination of the enhancement type transistor and the depletion type transistor (hereinafter, such a circuit is referred to as an EDMOS circuit) can be used for a driver circuit. The driver circuit includes at least a logic circuit portion, and a switch portion or a buffer portion. The logic circuit portion has a circuit structure including the above EDMOS circuit.

A principle of operation of a bottom-gate transistor including an oxide semiconductor will be described below.

Figure 13:
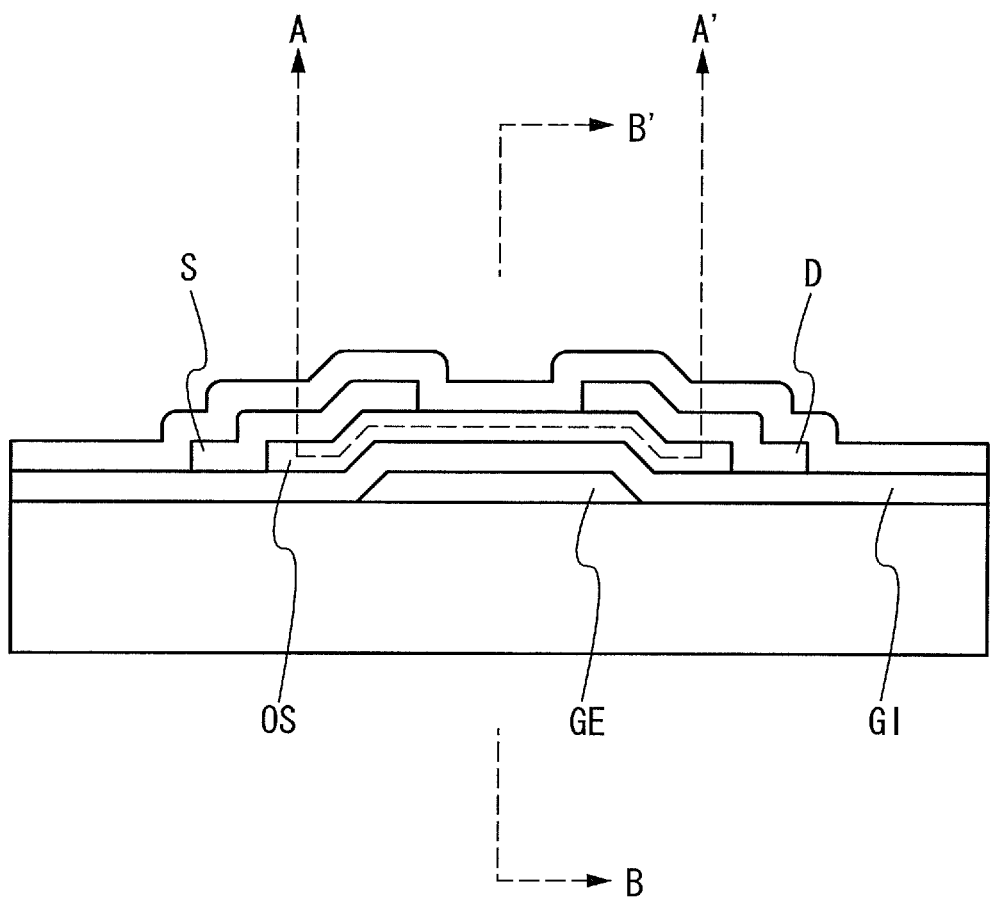
FIG. 13 is a longitudinal cross-sectional view of a bottom gate transistor including an oxide semiconductor.

FIG. 13 is a longitudinal cross-sectional view of a transistor including an oxide semiconductor. An oxide semiconductor layer (OS) is provided over a gate electrode (GE) with a gate insulating film (GI) provided therebetween, and a source electrode (S) and a drain electrode (D) are provided thereover. In addition, an oxide insulating layer overlapping with a channel formation region of the oxide semiconductor layer (OS) is provided the source electrode (S) and the drain electrode (D).

Figure 14:
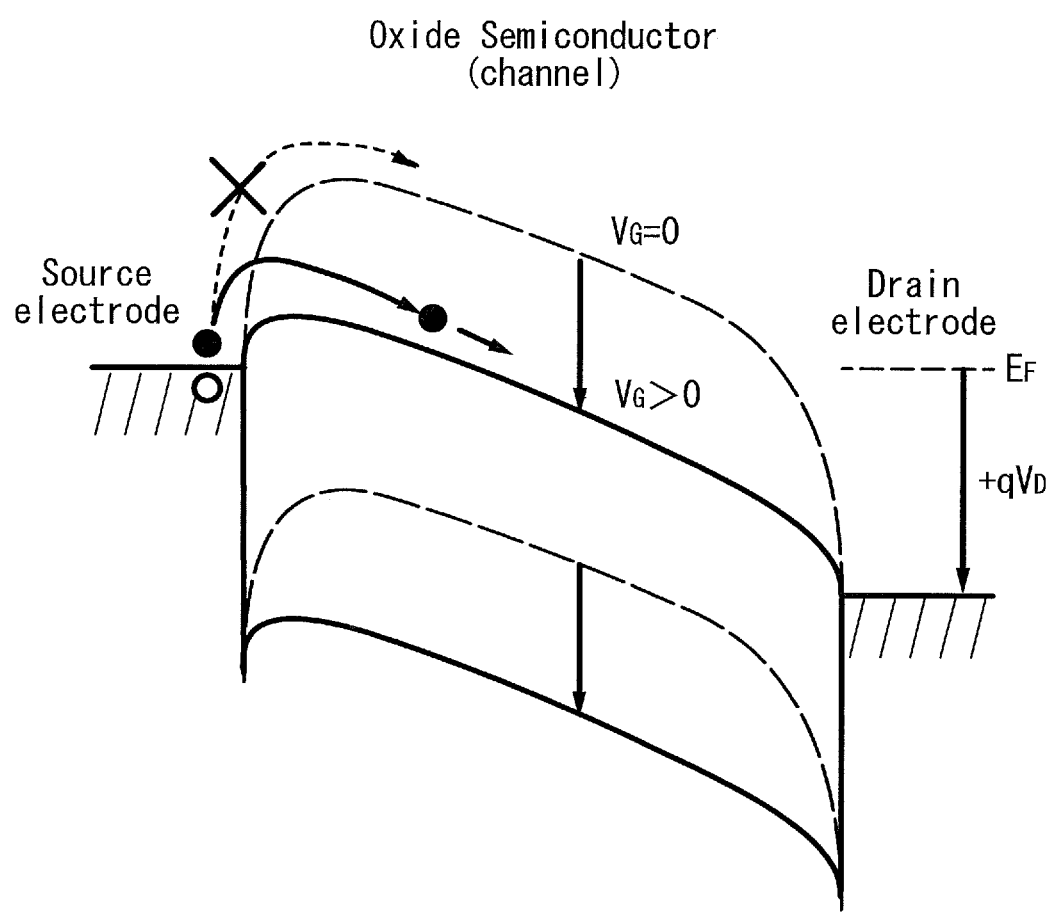
FIG. 14 is an energy band diagram (schematic diagrams) of a cross section along line A-A' illustrated in FIG. 13.

FIGS. 14A and 14B are energy band diagrams (schematic diagrams) along the cross section A-A' illustrated in FIG. 13. FIG. 14A shows the case where the source and the drain have voltage of the same potential ($V_D$=0 V). FIG. 14B shows the case where positive potential is applied to the drain ($V_D$>0) with respect to the source. In FIG. 14B, a black circle (●) and a white circle (○) represent an electron and a hole and have electric charges (−q, +q), respectively.

FIGS. 15A and 15B are energy band diagrams (schematic views) taken along the cross section B-B' of FIG. 13 in the case where a gate voltage is 0 V. FIG. 15A shows an on state in which a positive potential (+$V_G$) is applied to the gate (GE) and carriers (electrons) flow between the source and the drain. FIG. 15B shows a state in which a negative potential (−$V_G$) is applied to the gate (GE), that is, a case where the transistor is in an off state (where minority carriers do not flow).

When the thickness of the oxide semiconductor is approximately 50 nm and a donor concentration becomes less than or equal to $1 \times 10^{18}/cm^3$ by highly purifying the oxide semiconductor, a depletion layer spreads throughout the oxide semiconductor. In other words, the transistor can be regarded as a fully-depletion type transistor.

Figure 16:
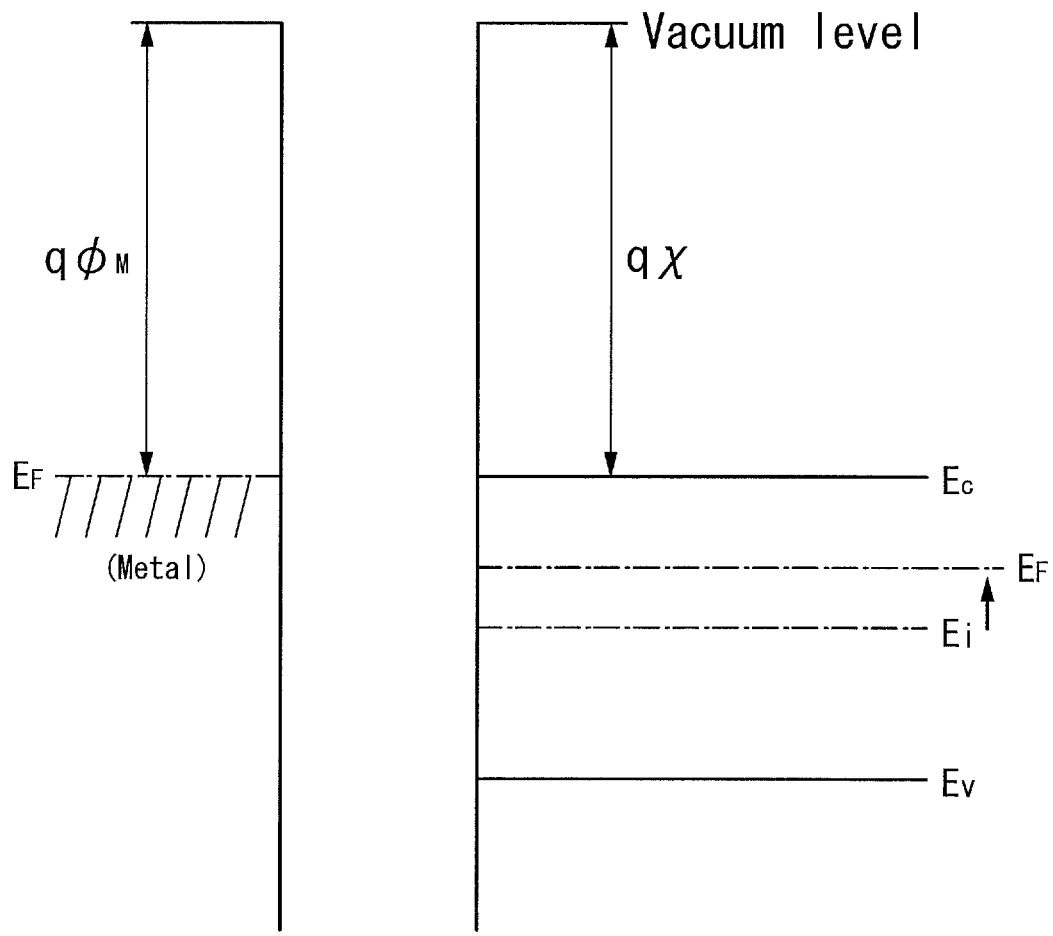
FIG. 16 is a view illustrating a relation between the vacuum level and a work function ($\phi$M) of a metal and a relation between the vacuum level and the electron affinity ($\chi$) of an oxide semiconductor.

FIG. 16 shows relation between the vacuum level and the work function of a metal (GM) and relation between the vacuum level and the electron affinity ($\chi$) of an oxide semiconductor.

Because metal degenerates, the conduction band and the Fermi level correspond to each other. On the other hand, a conventional oxide semiconductor is typically an n-type semiconductor; in that case, the Fermi level (Ef) is away from the intrinsic Fermi level (Ei) located in the middle of a band gap and is located closer to the conduction band. Note that it is known that hydrogen is a donor in an oxide semiconductor and is one factor causing an oxide semiconductor to be an n-type semiconductor.

On the other hand, an oxide semiconductor of the present invention is an intrinsic (i-type) or substantially intrinsic oxide semiconductor which is obtained by removing hydrogen that is an n-type impurity from an oxide semiconductor and purifying the oxide semiconductor so that an impurity that is not a main component of the oxide semiconductor is contained therein as little as possible. In other words, a feature is that a purified i-type (intrinsic) semiconductor, or a semiconductor close thereto, is obtained not by adding an impurity but by removing an impurity such as hydrogen or water as much as possible. This enables the Fermi level (Ef) to be at the same level as the intrinsic Fermi level (Ei).

An oxide semiconductor has a band gap (Eg) of 3.05 eV to 3.15 eV. In the case where the band gap (Eg) of an oxide semiconductor is 3.15 eV, the electron affinity ($\chi$) is said to be 4.3 eV. The work function of titanium (Ti) used for forming the source and drain electrodes is substantially equal to the electron affinity ($\chi$) of the oxide semiconductor. In that case, a Schottky barrier for electrons is not formed at an interface between the metal and the oxide semiconductor.

In other words, in the case where the work function of the metal ($\phi$M) and the electron affinity ($\chi$) of the oxide semiconductor are equal to each other and the metal and the oxide semiconductor are in contact with each other, an energy band diagram (a schematic diagram) as illustrated in FIG. 14A is obtained.

In FIG. 14B, a black circle (●) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 14A where no voltage is applied, that is, ½ of the band gap (Eg).

At this time, the electron moves in the bottom, which is energetically stable, on the oxide semiconductor side at the interface between the gate insulating film and the highly-purified oxide semiconductor as illustrated in FIG. 15A.

In addition, in FIG. 15B, when a negative potential (reverse bias) is applied to the gate electrode (G1), the value of current is extremely close to zero because holes that are minority carriers are substantially zero.

By increasing the purity of the oxide semiconductor so that the oxide semiconductor includes an impurity other than its main component as little as possible, an intrinsic (i-type) or substantially intrinsic oxide semiconductor is obtained. Consequently, the interface characteristics with the gate insulating film become obvious. Therefore, the interface characteristics need to be considered separately from bulk characteristics. Thus, the gate insulating film is needed to form a favorable interface with the oxide semiconductor. For example, it is preferable to use an insulating film which is formed by a CVD method which uses high density plasma generated with a power frequency from the VHF band to a microwave band or an insulating film formed by a sputtering method.

The oxide semiconductor is highly purified and the interface between the oxide semiconductor and the gate insulating film is made favorable, whereby transistor characteristics of off current of less than or equal to $10^{-13}$ A and a subthreshold swing (S value) of 0.1 V/dec. (the thickness of the gate insulating film: 100 nm) are highly expected even when the element has a channel width W of $1\times10^4$ µm and a channel length of 3 µm.

As described above, the oxide semiconductor is highly purified so that the oxide semiconductor includes an impurity other than its main component as little as possible, whereby a transistor with high mobility can be formed and favorable operation of the transistor can be obtained.

Embodiment 6

In this embodiment, the case where a first oxide component and a second oxide component are formed using oxide semiconductor materials including different components is described, whereas the case where the first oxide component and the second oxide component are formed using oxide semiconductor materials including the same components is described in Embodiment 5.

In this embodiment, a first oxide semiconductor layer with a thickness of 5 nm is formed using a metal oxide target which does not include Ga but includes In and Zn at 1:1 [atomic ratio]. In the case of a bottom-gate transistor, because oxide of Ga is an insulator, higher field effect mobility is obtained in the case where an In—Zn—O film is used as the first oxide semiconductor layer than in the case where an In—Ga—Zn—O film is used for the first oxide semiconductor layer.

Figure 17A:
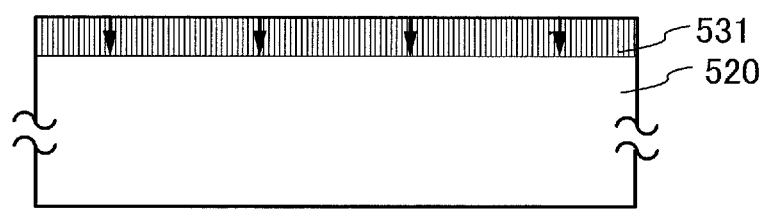
FIGS. 17A to 17C are cross-sectional views illustrating manufacturing steps of an embodiment of the present invention.

Next, first heat treatment is performed. By the first heat treatment, crystal growth is performed from a surface of the first oxide semiconductor layer, whereby a first oxide crystal component 531 which includes a polycrystal is formed so as to reach an interface between the first oxide semiconductor layer and a base component 520, although it depends on conditions such as materials of the first oxide semiconductor layer and the base component 520, heating temperature, and heating time (see FIG. 17A).

As the base component 520, an oxide layer, a metal layer, a nitride layer, and the like can be given. By the first heat treatment, crystal growth of the first oxide crystal component 531 which includes a polycrystal whose crystal direction is relatively aligned proceeds from the surface of the first oxide semiconductor layer in the depth direction regardless of the material of the base component. The first oxide crystal component 531 is c-axis-aligned perpendicularly to the surface.

Figure 17B:
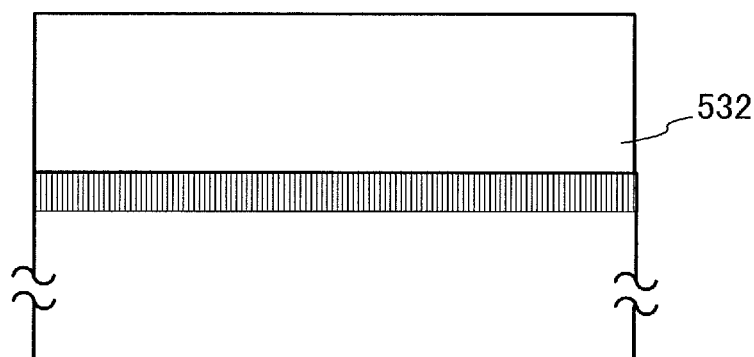

FIG. 17B is a cross-sectional view at the time just after a second oxide component 532 is deposited over the first oxide crystal component 531. In this embodiment, as the second oxide component 532, an In—Ga—Zn—O film with a thickness of 50 nm is formed using a target for an In—Ga—Zn—O-based oxide semiconductor (In:Ga:Zn=1:1:1[atomic ratio]).

Figure 17C:
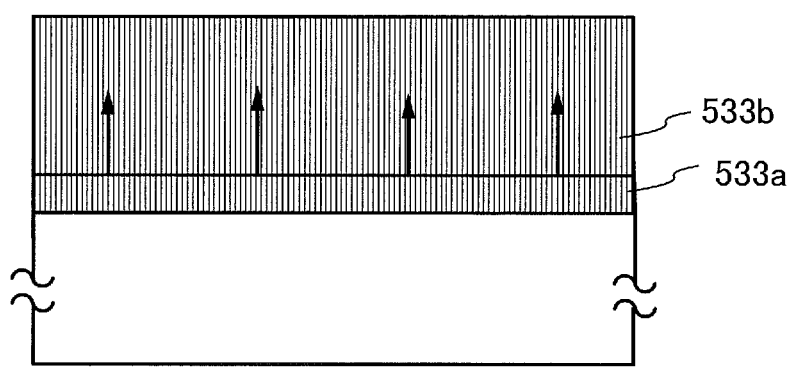

Then, after deposition of the second oxide component 532, second heat treatment is performed. By the second heat treatment, crystal growth is performed as illustrated in FIG. 17C. As illustrated in FIG. 17C, crystal growth proceeds upward toward a surface of the second oxide component using a crystal layer of the first oxide crystal component 531 as a seed, so that a second oxide crystal component 533b is formed.

The first oxide crystal component 531 obtained by the first heat treatment is heated again by the second heat treatment to be a third oxide crystal component 533a whose crystallinity is increased.

As the second oxide crystal component 532, an oxide semiconductor material whose component is different from that of the first oxide crystal component 531 is used. Therefore, as illustrated in FIG. 17C, a boundary between the third oxide crystal component 533a and the second oxide crystal component 533b is formed. In addition, also by the second heat treatment, almost the whole first oxide semiconductor layer including the vicinity of an interface with a gate insulating layer includes a polycrystal.

The structure of FIG. 17C can be referred to as a two-layer structure in which the first oxide crystal component 533a is stacked on and in contact with the base component 520 and the second oxide crystal component 533b is stacked thereover. By using the different materials, the field effect mobility of the transistor can be increased. In addition, by using the In—Zn—O film which is crystallized more easily than the In—Ga—Zn—O film as a seed of crystal growth, crystal growth is performed upward with high efficiency, so that the In—Ga—Zn—O film can include a polycrystal In addition, the case where the materials of the second oxide crystal component in which crystal growth is performed and the first oxide crystal component serving as a base are the same is referred to as homoepitaxy. The case where the materials of the second oxide crystal component in which crystal growth is performed and the first oxide crystal component serving as a base are different is referred to as heteroepitaxy. In this embodiment, any of homoepitaxy and heteroepitaxy can be employed by selection of respective materials.

The conditions of the first heat treatment and the conditions of the second heat treatment are within a range of the conditions described in Embodiment 5.

This embodiment can be freely combined with Embodiment 5.

Embodiment 7

In this embodiment, the case is described where a transistor including a stacked oxide material having a crystal layer which is c-axis-aligned is manufactured and a semiconductor device (also referred to as a display device) having a display function, which include the transistors in a pixel portion and further in a driver circuit is manufactured. Further, part or whole of a driver circuit using the transistor can be formed over the same substrate as a pixel portion, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Further, the display device includes a panel in which a display element is sealed. The display device relates to an embodiment of an element substrate before the display element is completed in a manufacturing process of the display device, and the element substrate is provided with a means for supplying a current to the display element in each of a plurality of pixels. Specifically, the element substrate may be in a state in which only a pixel electrode of the display element is formed, a state in which a conductive layer to be a pixel electrode is formed but is not etched yet to form the pixel electrode, or any other states.

A display device in this specification means an image display device or a display device.

Figure 18A:
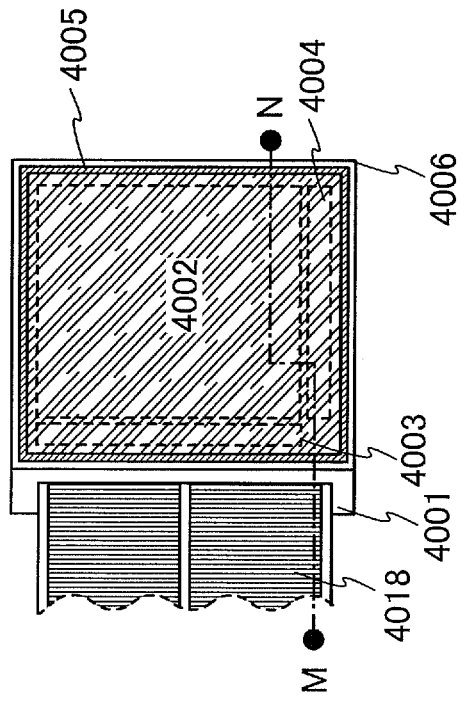
FIGS. 18A and 18B are a top view and a cross-sectional view illustrating an embodiment of the present invention.
Figure 18B:
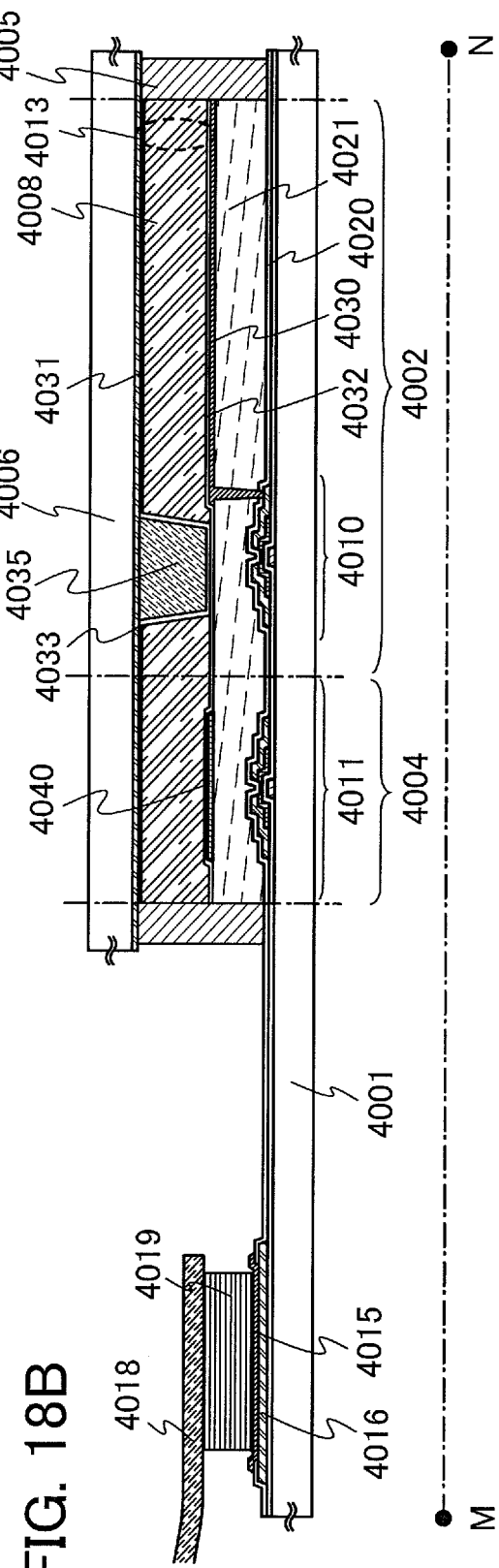

In this embodiment, an example of a liquid crystal display device is described as a semiconductor device which is an embodiment of the present invention. First, an appearance and a cross section of a liquid crystal display panel, which is an embodiment of a semiconductor device, will be described with reference to FIGS. 18A and 18B. FIG. 18A is a top view of a panel in which transistors 4010 and 4011 which include a semiconductor layer of a stacked oxide material including a c-axis-aligned crystal layer, and a liquid crystal element 4013, which are formed over a first substrate 4001, are sealed between the first substrate 4001 and a second substrate 4006 with a sealant 4005. FIG. 18B corresponds to a cross-sectional view taken along line M-N of FIG. 18A.

The sealant 4005 is provided so as to surround a pixel portion 4002, a signal line driver circuit 4003, and a scan line driver circuit 4004 which are provided over the first substrate 4001. The second substrate 4006 is provided over the pixel portion 4002, the signal line driver circuit 4003, and the scan line driver circuit 4004. Thus, the pixel portion 4002, the signal line driver circuit 4003, and the scan line driver circuit 4004 are sealed together with a liquid crystal layer 4008 by the first substrate 4001, the sealant 4005, and the second substrate 4006.

Further, the pixel portion 4002, the signal line driver circuit 4003, and the scan line driver circuit 4004 provided over the first substrate 4001 each include a plurality of transistors. FIG. 18B illustrates the transistor 4010 included in the pixel portion 4002 and the transistor 4011 included in the scan line driver circuit 4004. Insulating layers 4020 and 4021 are provided over the transistors 4010 and 4011.

As the transistors 4010 and 4011, a transistor including a stacked oxide material including a c-axis-aligned crystal layer described in Embodiment 5 can be used. In this embodiment, the transistors 4010 and 4011 are n-channel transistors.

A conductive layer 4040 is provided over part of the insulating layer 4021, which overlaps with a channel formation region of an oxide semiconductor layer in the transistor 4011 for the driver circuit. The conductive layer 4040 is provided at the position overlapping with the channel formation region of the oxide semiconductor layer, whereby the amount of change in threshold voltage of the transistor 4011 between before and after the BT test can be reduced. The conductive layer 4040 may have the same potential as or have potential different from that of the gate electrode layer of the transistor 4011 and can function as a second gat electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, which each function as an alignment film, and the liquid crystal layer 4008 is sandwiched between the pixel electrode layer 4030 and the counter electrode layer 4031 with the insulating layers 4032 and 4033 therebetween.

Note that as the second substrate 4006, glass or plastics can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

A columnar spacer 4035 which can be obtained in such a manner that an insulating layer is selectively etched is provided to control a distance (a cell gap) between the pixel electrode layer 4030 and the counter electrode layer 4031. Alternatively, a spherical spacer may also be used. The counter electrode layer 4031 is electrically connected to a common potential line formed over the substrate where the transistor 4010 is formed. In addition, with the use of a common connection portion, the counter electrode layer 4031 and the common potential line can be electrically connected to each other through conductive particles arranged between the pair of substrates. Note that the conductive particles are included in the sealant 4005.

Alternatively, liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase appears within an only narrow range of temperature, liquid crystal composition containing a chiral agent at 5 wt % or more so as to improve the temperature range is used for the liquid crystal layer 4008. The liquid crystal composition which includes a liquid crystal exhibiting a blue phase and a chiral agent has a short response time of 1 msec or less, has optical isotropy, which makes the alignment process unneeded, and has a small viewing angle dependence.

When liquid crystal exhibiting a blue phase is used, rubbing treatment on an alignment film is unnecessary; accordingly, electrostatic discharge damage caused by the rubbing treatment can be prevented and defects and damage of the liquid crystal display device in the manufacturing process can be reduced. Thus, productivity of the liquid crystal display device can be increased. A transistor including an oxide semiconductor layer particularly has a possibility that electrical characteristics of the transistor might significantly change and deviate from the designed range due to the influence of static electricity. Therefore, it is more effective to use a liquid crystal material exhibiting a blue phase for a liquid crystal display device including a transistor including an oxide semiconductor layer.

Note that the liquid crystal display device described in this embodiment is an example of a transmissive liquid crystal display device; however, the liquid crystal display device can be applied to either a reflective liquid crystal display device or a semi-transmissive liquid crystal display device.

An example of the liquid crystal display device described in this embodiment is illustrated in which a polarizing plate is provided on the outer surface of the substrate (on the viewer side) and a coloring layer and an electrode layer used for a display element are provided on the inner surface of the substrate in that order; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. A light-blocking layer which functions as a black matrix may be provided when needed.

In this embodiment, in order to reduce surface unevenness of the transistors and to improve reliability of the transistors, the transistors are covered with the insulating layers (the insulating layer 4020 and the insulating layer 4021) which function as protective layers or planarizing insulating layers. Note that the protective layer is provided to prevent entry of a contaminant impurity such as an organic substance, a metal substance, or moisture floating in air, and is preferably a dense film. The protective layer may be formed with a single layer or a stacked layer of a silicon oxide layer, a silicon nitride layer, a silicon oxynitride layer, a silicon nitride oxide layer, an aluminum oxide layer, an aluminum nitride layer, an aluminum oxynitride layer, and/or an aluminum nitride oxide layer by a sputtering method. In this embodiment, an example in which the protective layer is formed by a sputtering method is described; however, there is no particular limitation on a method, and various kinds of methods may be used.

Here, the insulating layer 4020 having a stacked structure is formed as the protective layer. As a first layer of the insulating layer 4020, a silicon oxide layer is formed by a sputtering method. The use of a silicon oxide layer as the protective layer provides an advantageous effect of preventing hillock of an aluminum layer used for a source electrode layer and a drain electrode layer.

An insulating layer is formed as a second layer of the protective layer. Here, as a second layer of the insulating layer 4020, a silicon nitride layer is formed by a sputtering method. The use of the silicon nitride layer as the protective layer can prevent ions such as sodium ions from entering a semiconductor region, thereby suppressing variations in electric characteristics of the transistors.

The insulating layer 4021 is formed as the planarizing insulating layer. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, or offset printing), or the like. Further, the insulating layer 4021 can be formed with a doctor knife, a roll coater, a curtain coater, a knife coater, or the like. In the case of forming the insulating layer 4021 using a material solution, annealing (at 300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

A variety of signals and potentials are supplied to the signal line driver circuit 4003 which is formed separately, and the scan line driver circuit 4004 or the pixel portion 4002 from an FPC 4018.

In this embodiment, a connection terminal electrode 4015 is formed using the same conductive layer as the pixel electrode layer 4030 included in the liquid crystal element 4013. A terminal electrode 4016 is formed using the same conductive layer as the source and drain electrode layers included in the transistors 4010 and 4011.

The connection terminal electrode 4015 is electrically connected to a terminal included in the FPC 4018 through an anisotropic conductive layer 4019.

Note that FIGS. 18A and 18B illustrate an example in which the signal line driver circuit 4003 is formed separately and mounted on the first substrate 4001; however, this embodiment is not limited to this structure. The scan line driver circuit may be formed over the same substrate as the pixel portion 4002, or only part of the signal line driver circuit or part of the scan line driver circuit may be formed over the same substrate as the pixel portion 4002.

In addition, if needed, a color filter is provided for each of the pixels. In addition, a polarizing plate or a diffusion plate is provided on the outer sides of the first substrate 4001 and the second substrate 4006. Further, a light source of a backlight is formed using a cold-cathode tube or an LED. Thus, a liquid crystal display module is obtained.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Through the above process, a highly reliable liquid crystal display device can be manufactured.

By manufacturing a transistor in the driver circuit of the liquid crystal display device using the method for manufacturing a stacked oxide material including a c-axis-aligned crystal layer which is described in Embodiment 5, a normally-off transistor can be provided in the driver circuit portion and power consumption can be reduced.

This embodiment can be implemented in appropriate combination with the structures described in the other embodiments.

Embodiment 8

Figure 19A:
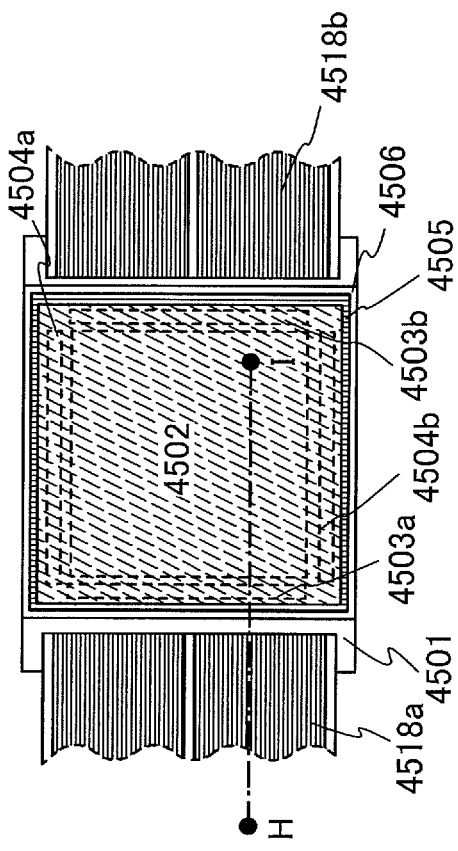
FIGS. 19A and 19B are a top view and a cross-sectional view illustrating an embodiment of the present invention.
Figure 19B:
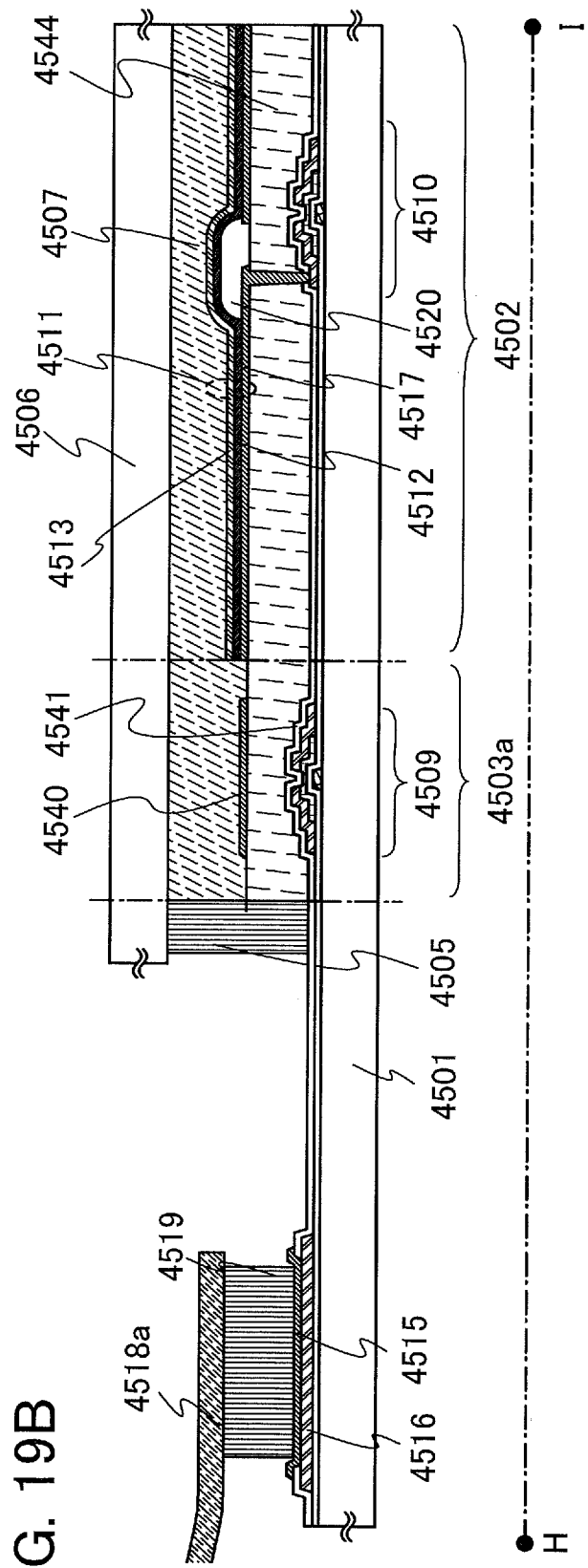

An appearance and a cross section of a light-emitting display panel (also referred to as a light-emitting panel) which corresponds to one embodiment of a semiconductor device will be described with reference to FIGS. 19A and 19B. FIG. 19A is a plan view of a panel in which a transistor including a stacked oxide material including a c-axis-aligned crystal layer and a light-emitting element, which are formed over a first substrate, are sealed between the first substrate and a second substrate with a sealant. FIG. 19B is a cross-sectional view along line H-I of FIG. 19A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507 by the first substrate 4501, the sealant 4505, and the second substrate 4506. It is preferable that a panel be thus packaged (sealed) with a protective film (such as a laminate film or an ultraviolet curable resin film) or a cover material with high air-tightness and little degasification so that the pixel portion 4502, the signal line driver circuits 4503a and 4503b, and the scan line driver circuits 4504a and 4504b are not exposed to the outside air.

The pixel portion 4502, the signal line driver circuits 4503a and 4503b, and the scan line driver circuits 4504a and 4504b formed over the first substrate 4501 each include a plurality of transistors, and a transistor 4510 included in the pixel portion 4502 and a transistor 4509 included in the signal line driver circuit 4503a are illustrated as an example in FIG. 19B.

For the transistors 4509 and 4510, a highly reliable transistor including a stacked oxide material including a c-axis-aligned crystal layer described in Embodiment 5 can be employed. In this embodiment, the transistors 4509 and 4510 are n-channel transistors.

A conductive layer 4540 is provided over part of the insulating layer 4544, which overlaps with a channel formation region of an oxide semiconductor layer in the transistor 4509 for the driver circuit. The conductive layer 4540 is provided at the position overlapping with the channel formation region of the oxide semiconductor layer, whereby the amount of change in threshold voltage of the transistor 4509 between before and after the BT test can be reduced. The conductive layer 4540 may have the same potential as or have potential different from that of the gate electrode layer of the transistor 4509 and can function as a second gate electrode layer. Alternatively, the potential of the conductive layer 4540 may be GND or 0 V, or the conductive layer 4540 may be in a floating state.

In the transistor 4509, an insulating layer 4541 is formed in contact with the semiconductor layer including the channel formation region, as a protective insulating layer. The insulating layer 4541 may be formed using a material and a method which are similar to those of the oxide insulating layer 407 described in Embodiment 5. Moreover, the insulating layer 4544 functioning as a planarizing insulating layer covers the transistors in order to reduce surface unevenness of the transistors. Here, a silicon oxide layer is formed as the insulating layer 4541 by a sputtering method in a manner similar to that of the oxide insulating layer 407 described in Embodiment 5.

The insulating layer 4544 is formed as the planarizing insulating layer over the insulating layer 4541. The insulating layer 4544 may be formed using a material and a method which are similar to those of the insulating layer 4021 described in Embodiment 7. Here, acrylic is used for the insulating layer 4544.

Moreover, reference numeral 4511 denotes a light-emitting element. A first electrode layer 4517 which is a pixel electrode included in the light-emitting element 4511 is electrically connected to a source or drain electrode layer of the transistor 4510. Note that the structure of the light-emitting element 4511 is, but not limited to, the stack structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition wall 4520 is made of an organic resin layer, an inorganic insulating layer, or organic polysiloxane. It is particularly preferable that the partition wall 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective layer may be formed over the second electrode layer 4513 and the partition wall 4520 in order to prevent oxygen, hydrogen, moisture, carbon dioxide, or the like from entering into the light-emitting element 4511. As the protective layer, a silicon nitride layer, a silicon nitride oxide layer, a DLC layer, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive layer as the first electrode layer 4517 included in the light-emitting element 4511, and a terminal electrode 4516 is formed from the same conductive layer as the source and drain electrode layers included in the thin film transistors 4509 and 4510.

The connection terminal electrode 4515 is electrically connected to a terminal included in the FPC 4518a through an anisotropic conductive layer 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Through the above steps, a highly reliable light-emitting display device (display panel) can be manufactured.

This embodiment can be implemented in appropriate combination with the structures described in the other embodiments.

Embodiment 9

An example of electronic paper will be described as an embodiment of a semiconductor device.

A transistor including a stacked oxide material including a c-axis-aligned crystal layer obtained by the method described in Embodiment 5 may be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles have a color which is different from that of the second particles (the particles may also be colorless).

Thus, an electrophoretic display is a display that utilizes a so-called dielectrophoretic effect by which a substance having a high dielectric constant moves to a high electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

When a plurality of the above microcapsules are arranged as appropriate over an active matrix substrate so as to be interposed between two electrodes, an active matrix display device can be completed, and display can be performed by application of an electric field to the microcapsules. For example, an active matrix substrate obtained using a transistor including a stacked oxide material including a c-axis-aligned crystal layer described in Embodiment 5 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 20:
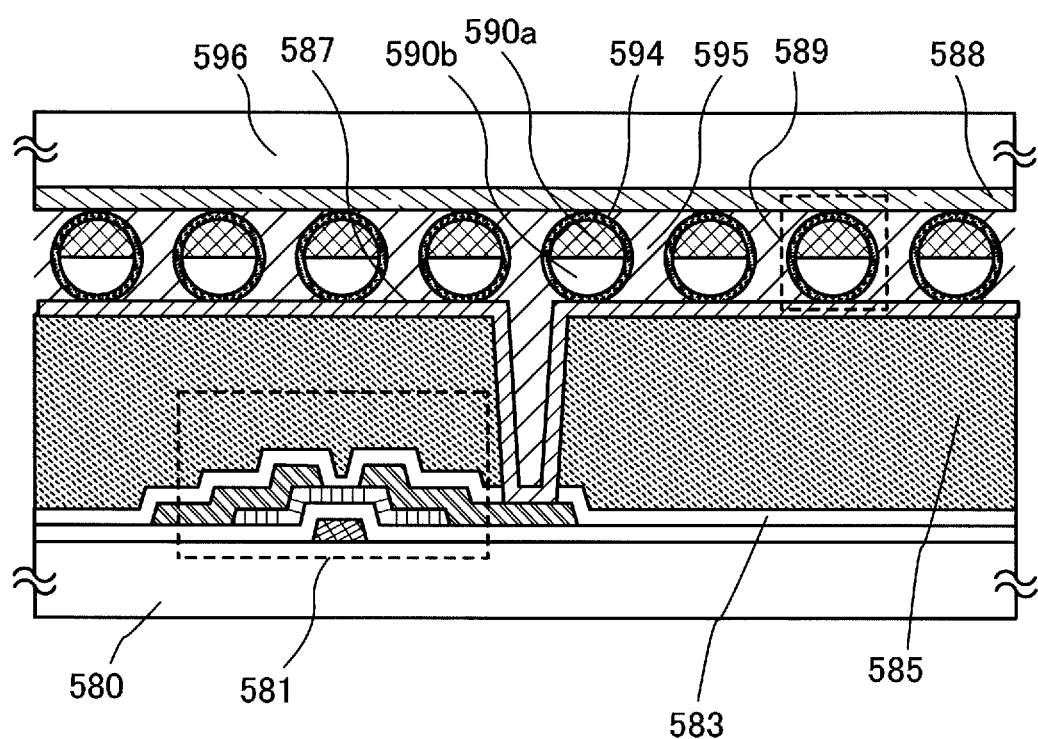
FIG. 20 is a cross-sectional view of an embodiment of the present invention.

FIG. 20 illustrates active matrix electronic paper as an example of a semiconductor device. A transistor 581 used for the semiconductor device can be manufactured in a manner similar to that of the transistor described in Embodiment 5 and is a highly reliable transistor including a stacked oxide material including a c-axis-aligned crystal layer.

The electronic paper in FIG. 20 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 is a bottom gate transistor and is covered with an insulating layer 583 which is in contact with a semiconductor layer. A source or drain electrode layer of the transistor 581 is in contact with a first electrode layer 587 through an opening formed in the insulating layer 583 and an insulating layer 585, whereby the thin film transistor 581 is electrically connected to the first electrode layer 587. Between a pair of substrates 580 and 596, spherical particles 589 each having a black region 590a, a white region 590b, and a cavity 594 around the regions which is filled with liquid are provided between the first electrode layer 587 and a second electrode layer 588. A space around the spherical particles 589 is filled with a filler 595 such as a resin (see FIG. 20).

The first electrode layer 587 corresponds to a pixel electrode, and the second electrode layer 588 corresponds to a common electrode. The second electrode layer 588 is electrically connected to a common potential line provided over the same insulating substrate as the transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of approximately 10 μm to 200 μm in which transparent liquid, positively charged white microparticles, and negatively charged black microparticles are encapsulated is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized even in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, highly reliable electronic paper can be manufactured.

This embodiment can be implemented in appropriate combination with the structures described in the other embodiments.

Embodiment 10

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

In this embodiment, examples of an electronic appliance mounted with a display device which can be obtained in any of Embodiments 7 to 9 are described with reference to FIGS. 21A to 21E and FIG. 22.

Figure 21A:
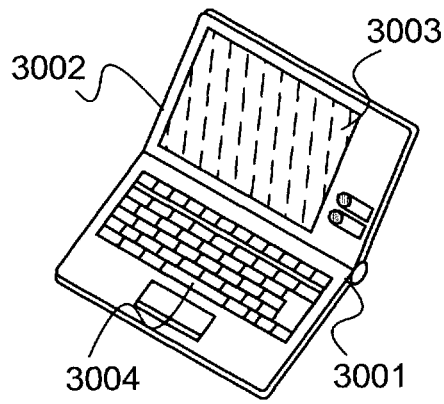
FIGS. 21A to 21E are each an example of an electronic device.

FIG. 21A illustrates a laptop personal computer manufactured by mounting at least a display device as a component, which includes a main body 3001, a housing 3002, a display portion 3003, a keyboard 3004, and the like. Note that the laptop personal computer includes the liquid crystal display device described in Embodiment 7.

Figure 21D:
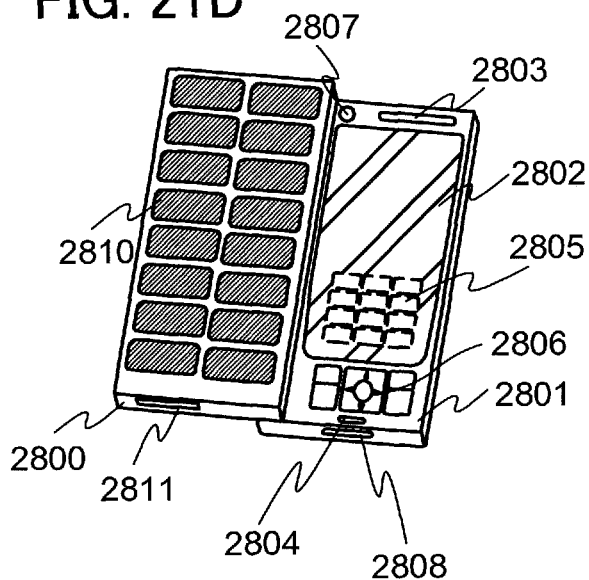
Figure 21B:
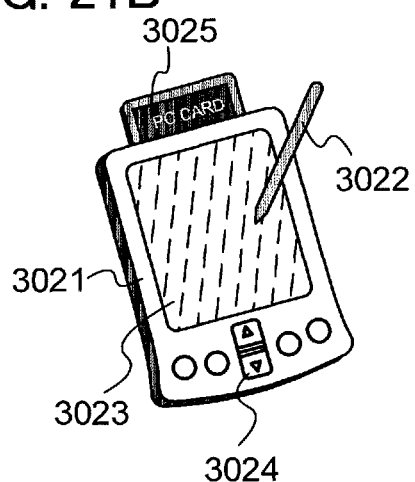

FIG. 21B is a portable information terminal (PDA) manufactured by mounting at least a display device as a component, which includes a display portion 3023, an external interface 3025, an operation button 3024, and the like in a main body 3021. A stylus 3022 is included as an accessory for operation. Note that the portable information terminal includes the light-emitting display device described in Embodiment 8.

Figure 21E:
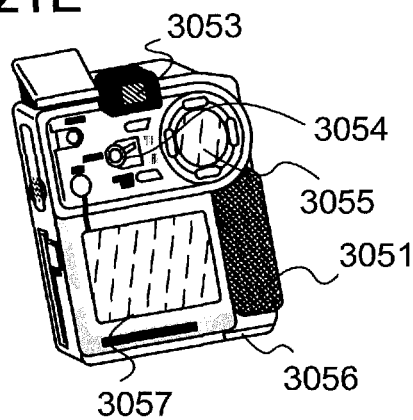
Figure 21C:
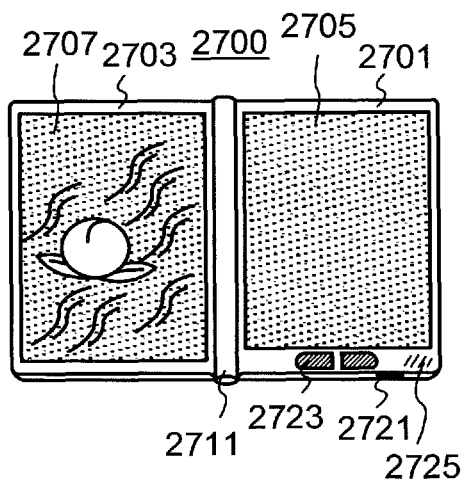

FIG. 21C is an e-book reader manufactured by mounting the electronic paper described in Embodiment 9 as a component. FIG. 21C illustrates an e-book reader 2700. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 21C) and images can be displayed on a display portion on the left side (the display portion 2707 in FIG. 21C).

FIG. 21C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to an AC adapter and various cables such as a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

FIG. 21D is a mobile phone manufactured by mounting at least a display device as a component, which includes two housings: a housing 2800 and a housing 2801. The housing 2801 is provided with a display panel 2802, a speaker 2803, a microphone 2804, a pointing device 2806, a camera lens 2807, an external connection terminal 2808, and the like. The housing 2801 is also provided with a solar battery cell 2810 for charging of the portable information terminal, an external memory slot 2811, and the like. Further, an antenna is incorporated in the housing 2801.

The display panel 2802 is provided with a touch panel. A plurality of operation keys 2805 which is displayed as images is illustrated by dashed lines in FIG. 21D. Note that a booster circuit by which a voltage output from the solar cell 2810 is increased to be sufficiently high for each circuit is also included.

In the display panel 2802, the display direction can be changed as appropriate depending on a usage pattern. Further, the mobile phone is provided with the camera lens 2807 on the same surface as the display panel 2802, and thus can be used as a videophone. The speaker 2803 and the microphone 2804 can be used for videophone calls, recording and playing sound, and the like as well as voice calls. Moreover, the housings 2800 and 2801 in a state where they are developed as illustrated in FIG. 21D can be slid so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided.

FIG. 21E is a digital camera manufactured by mounting at least a display device as a component, which includes a main body 3051, a display portion (A) 3057, an eyepiece 3053, operation switches 3054, a display portion (B) 3055, a battery 3056, and the like.

Figure 22:
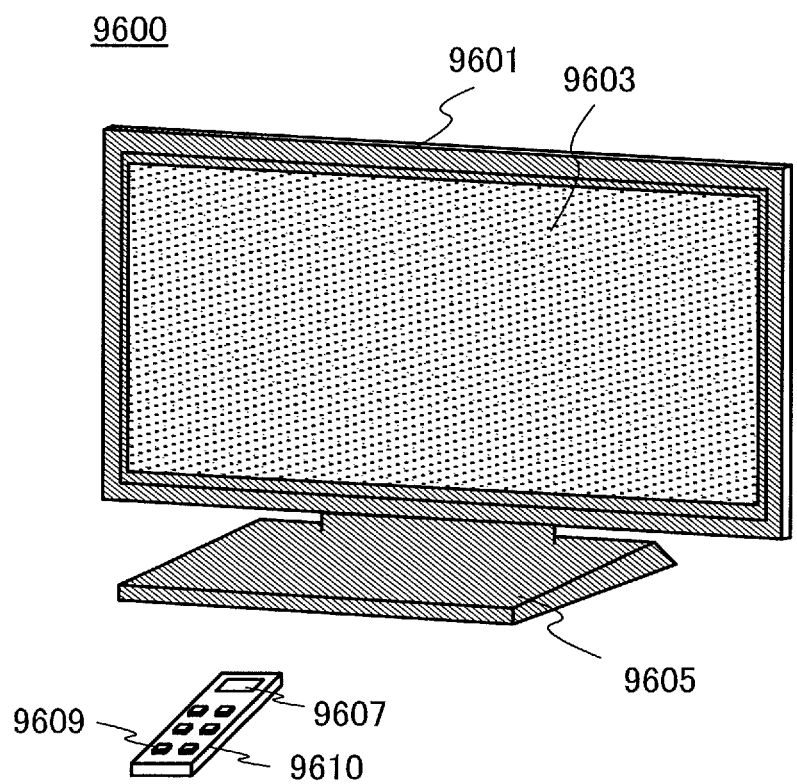
FIG. 22 is an example of an electronic device.

FIG. 22 illustrates a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610, whereby an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the television set 9600 is connected to a communication network with or without wires via the modem, one-way (from a sender to a receiver) or two-way (between a sender and a receiver or between receivers) information communication can be performed.

In the display portion 9603, a plurality of transistors described in Embodiment 5 is provided as switching elements of pixels. As a driver circuit formed over the same insulating substrate as the display portion 9603, a transistor with high mobility, which is described in Embodiment 5, is provided.

This embodiment can be freely combined with any one of Embodiments 1 to 9.

This application is based on Japanese Patent Application serial no. 2009-276918 filed with Japan Patent Office on Dec. 4, 2009, the entire contents of which are hereby incorporated by reference.

EXPLANATION OF REFERENCES

400: substrate, 401: gate electrode layer, 402: gate insulating layer, 403: first oxide semiconductor layer, 404: second oxide semiconductor layer, 405a: source electrode layer, 405b: drain electrode layer, 407: oxide insulating layer, 430: oxide semiconductor stack, 431: island-shaped oxide semiconductor stack, 432: oxide semiconductor stack, 470: transistor, 500: base component, 501: first oxide crystal component, 502: oxide semiconductor layer, 503a: oxide crystal component, 503b: oxide crystal component, 520: base component, 531: oxide crystal component, 532: oxide component, 533a: oxide crystal component, 533b: oxide crystal component, 580: substrate, 581: transistor, 583: insulating layer, 585: insulating layer, 587: electrode layer, 588: electrode layer, 589: spherical particle, 590a: black region, 580b: white region, 594: cavity, 595: filler, 596: substrate, 1501: glass substrate, 1502: pixel portion, 1503: gate driver, 1504: gate driver, 1505: analog switch, 1506: FPC, 1507: FPC, 1508: FPC, 1509: FPC, 1701: glass substrate, 1702: pixel portion, 1703: gate driver, 1704: gate driver, 1705: source driver, 1706: FPC, 1707: FPC, 1711: glass substrate, 1712: pixel portion, 1713: gate driver, 1714: gate driver, 1715: gate driver, 1716: gate driver, 1717: source driver, 1718: source driver, 1719: source driver, 1720: source driver, 1721: FPC, 1722: FPC, 1723: FPC, 1724: FPC, 2700: e-book reader, 2701: housing, 2703: housing, 2705: display portion, 2707: display portion, 2711: hinge, 2721: power switch, 2723: operation key, 2725: speaker, 2800: housing, 2801: housing, 2802: display panel, 2803: speaker, 2804: microphone, 2805: operation key, 2806: pointing device, 2807: camera lens, 2808: external connection terminal, 2810: solar battery cell, 2811: external memory slot, 3001: main body, 3002: housing, 3003: display portion, 3004: keyboard, 3021: main body, 3022: stylus, 3023: display portion, 3024: operation button, 3025: external interface, 3051: main body, 3053: eyepiece, 3054: operation switch, 3055: display portion (B), 3056: battery, 3057: display portion (A), 4001: substrate, 4002: pixel portion, 4003: signal line driver circuit, 4004: scan line driver circuit, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive layer, 4020: insulating layer, 4021: insulating layer, 4030: pixel electrode layer, 4031: counter electrode layer, 4032: insulating layer, 4033: insulating layer, 4035: spacer, 4040: conductive layer, 4501: substrate, 4502: pixel portion, 4503a: signal line driver circuit, 4503b: signal line driver circuit, 4504a: scan line driver circuit, 4504b: scan line driver circuit, 4505: sealant, 4506: substrate, 4507: filler, 4509: transistor, 4510: transistor, 4511: light-emitting element, 4512: electroluminescent layer, 4513: electrode layer, 4515: connection terminal electrode, 4516: terminal electrode, 4517: electrode layer, 4518a: FPC, 4518b: FPC, 4519: anisotropic conductive layer, 4520: partition wall, 4540: conductive layer, 4541: insulating layer, 4544: insulating layer, 9600: television set, 9601: housing, 9603: display portion, 9605: stand, 9607: display portion, 9609: operation key, and 9610: remote controller.

The invention claimed is:

1. A semiconductor device comprising:
a substrate comprising a top surface;
a gate electrode layer over the substrate, and comprising a top surface and a side surface, the side surface having an inclination with respect to the top surface of the substrate;
an oxide semiconductor layer over the substrate with the gate electrode layer interposed therebetween, and comprising a first portion facing the top surface of the gate electrode layer, and a second portion inclined in response to the inclination of the side surface of the gate electrode layer;
a gate insulating layer between the gate electrode layer and the oxide semiconductor layer; and
a source electrode layer and a drain electrode layer over and in electrical contact with the oxide semiconductor layer,
wherein the oxide semiconductor layer has crystallinity,
wherein c-axis of a first crystal of the first portion of the oxide semiconductor layer is substantially perpendicular to a surface of the first portion of the oxide semiconductor layer, and
wherein c-axis of a second crystal of the second portion of the oxide semiconductor layer is substantially perpendicular to a surface of the second portion of the oxide semiconductor layer.

2. A semiconductor device comprising:
a substrate comprising a top surface;
a gate electrode layer over the substrate, and comprising a top surface and a side surface, the side surface having an inclination with respect to the top surface of the substrate;
an oxide semiconductor layer over the substrate with the gate electrode layer interposed therebetween, and comprising a first portion facing the top surface of the gate electrode layer, and a second portion inclined in response to the inclination of the side surface of the gate electrode layer;
a gate insulating layer between the gate electrode layer and the oxide semiconductor layer, the gate insulating layer comprising a first stack of a first silicon nitride layer and a first silicon oxide layer;
a source electrode layer and a drain electrode layer on and in direct contact with the oxide semiconductor layer; and
an insulating layer comprising a second stack of a second silicon oxide layer and a second silicon nitride layer over the second silicon oxide layer, the second silicon oxide layer being in direct contact with the source electrode layer, the drain electrode layer, and the oxide semiconductor layer,
wherein the oxide semiconductor layer has crystallinity,
wherein c-axis of a first crystal of the first portion of the oxide semiconductor layer is substantially perpendicular to a surface of the first portion of the oxide semiconductor layer, and
wherein c-axis of a second crystal of the second portion of the oxide semiconductor layer is substantially perpendicular to a surface of the second portion of the oxide semiconductor layer.

3. A semiconductor device comprising:
a substrate comprising a top surface;
a gate electrode layer over the substrate, and comprising a top surface and a side surface, the side surface having an inclination with respect to the top surface of the substrate;
an oxide semiconductor layer over the substrate with the gate electrode layer interposed therebetween, and comprising a first portion facing the top surface of the gate electrode layer, and a second portion inclined in response to the inclination of the side surface of the gate electrode layer;
a gate insulating layer between the gate electrode layer and the oxide semiconductor layer; and
a source electrode layer and a drain electrode layer over and in electrical contact with the oxide semiconductor layer,
wherein the source electrode layer and the drain electrode layer overlap with the gate electrode layer and are on and in direct contact with side end portions of the oxide semiconductor layer,
wherein the oxide semiconductor layer has crystallinity,
wherein c-axis of a first crystal of the first portion of the oxide semiconductor layer is substantially perpendicular to a surface of the first portion of the oxide semiconductor layer, and
wherein c-axis of a second crystal of the second portion of the oxide semiconductor layer is substantially perpendicular to a surface of the second portion of the oxide semiconductor layer.

4. The semiconductor device according to claim 1, further comprising:
an oxide layer on and in direct contact with the oxide semiconductor layer.

5. The semiconductor device according to claim 3, further comprising:
an oxide layer on and in direct contact with the oxide semiconductor layer.

6. The semiconductor device according to claim 1, further comprising:
a silicon oxide layer on and in direct contact with the source electrode layer, the drain electrode layer, and the oxide semiconductor layer; and
a silicon nitride layer over the silicon oxide layer.

7. The semiconductor device according to claim 3, further comprising:
a silicon oxide layer on and in direct contact with the source electrode layer, the drain electrode layer, and the oxide semiconductor layer; and
a silicon nitride layer over the silicon oxide layer.

8. The semiconductor device according to claim 4,
wherein each of the gate insulating layer and the oxide layer comprises silicon, nitrogen, and oxygen.

9. The semiconductor device according to claim 5,
wherein each of the gate insulating layer and the oxide layer comprises silicon, nitrogen, and oxygen.

10. The semiconductor device according to claim 2,
wherein the source electrode layer and the drain electrode layer overlap with the gate electrode layer and are on and in direct contact with side end portions of the oxide semiconductor layer.

11. The semiconductor device according to claim 1, further comprising:
an inorganic insulating layer over the source electrode layer and the drain electrode layer;
an organic insulating layer over the inorganic insulating layer; and
a conductive layer over the organic insulating layer and electrically connected to one of the source electrode layer and the drain electrode layer via a contact hole in the organic insulating layer.

12. The semiconductor device according to claim 2, further comprising:
an organic insulating layer over the second silicon nitride layer; and
a conductive layer over the organic insulating layer and electrically connected to one of the source electrode layer and the drain electrode layer via a contact hole in the organic insulating layer.

13. The semiconductor device according to claim 3, further comprising:
an inorganic insulating layer over the source electrode layer and the drain electrode layer;
an organic insulating layer over the inorganic insulating layer; and
a conductive layer over the organic insulating layer and electrically connected to one of the source electrode layer and the drain electrode layer via a contact hole in the organic insulating layer.

14. The semiconductor device according to claim 11,
wherein the conductive layer is a pixel electrode.

15. The semiconductor device according to claim 12,
wherein the conductive layer is a pixel electrode.

16. The semiconductor device according to claim 13,
wherein the conductive layer is a pixel electrode.

17. The semiconductor device according to claim 1,
wherein the oxide semiconductor layer comprises indium, gallium, and zinc.

18. The semiconductor device according to claim 2,
wherein the oxide semiconductor layer comprises indium, gallium, and zinc.

19. The semiconductor device according to claim 3,
wherein the oxide semiconductor layer comprises indium, gallium, and zinc.

* * * * *